(12) United States Patent
Kaneko

(10) Patent No.: US 9,377,691 B2
(45) Date of Patent: Jun. 28, 2016

(54) COATING AND DEVELOPING APPARATUS, COATING AND DEVELOPING METHOD AND STORAGE MEDIUM

(71) Applicant: Tokyo Electron Limited, Tokyo (JP)

(72) Inventor: Tomohiro Kaneko, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 139 days.

(21) Appl. No.: 14/469,759

(22) Filed: Aug. 27, 2014

(65) Prior Publication Data

US 2015/0077726 A1   Mar. 19, 2015

(30) Foreign Application Priority Data

Sep. 18, 2013   (JP) ................. 2013-193025

(51) Int. Cl.
*G03D 5/00* (2006.01)
*G03F 7/16* (2006.01)

(52) U.S. Cl.
CPC ........................ *G03F 7/16* (2013.01)

(58) Field of Classification Search
CPC ........................................................ G03F 7/16
USPC .......................................................... 396/611
See application file for complete search history.

(56) References Cited

U.S. PATENT DOCUMENTS

| | | | | |
|---|---|---|---|---|
| 5,700,127 A * | 12/1997 | Harada | ............ | H01L 21/67161 118/719 |
| 5,803,932 A * | 9/1998 | Akimoto | ........... | H01L 21/67173 118/500 |
| 6,377,329 B1 * | 4/2002 | Takekuma | .......... | H01L 21/6715 118/719 |
| 7,210,864 B2 * | 5/2007 | Higashi | ............... | H01L 21/6715 355/27 |
| 7,801,641 B2 * | 9/2010 | Yoshikawa | ............. | B65G 37/02 414/222.01 |
| 8,057,114 B2 * | 11/2011 | Hayashida | ........ | H01L 21/67051 396/611 |
| 2006/0182533 A1 * | 8/2006 | Ogi | .................... | H01L 21/67196 414/217 |
| 2008/0019809 A1 * | 1/2008 | Takano | ............. | H01L 21/67745 414/222.01 |
| 2008/0117390 A1 * | 5/2008 | Kaneko | .................. | G03F 7/7075 355/27 |
| 2009/0059187 A1 * | 3/2009 | Hara | .................... | G03F 7/70525 355/27 |
| 2010/0068009 A1 * | 3/2010 | Kimura | ............. | H01L 21/67778 414/217.1 |
| 2015/0051944 A1 * | 2/2015 | Shekhar | ........... | G06Q 10/06316 705/7.26 |
| 2015/0139758 A1 * | 5/2015 | Ito | ....................... | H01L 21/6776 414/222.02 |

FOREIGN PATENT DOCUMENTS

| | | |
|---|---|---|
| JP | 2004-311511 A | 11/2004 |
| JP | 2005-203635 A | 7/2005 |
| JP | 2008-258208 A | 10/2008 |
| JP | 2013-162029 A | 8/2013 |

* cited by examiner

*Primary Examiner* — Rodney Fuller
(74) *Attorney, Agent, or Firm* — Abelman, Frayne & Schwab

(57) ABSTRACT

A coating and developing apparatus forms a coating film including a resist film on a substrate and performs developing on the substrate after exposure and a plurality of unit blocks performing the same processing each includes plural kinds of processing modules. A control unit outputs a control signal to perform preparing individual conveying schedules for the one substrate according to the condition when the one substrate distributed into unit blocks is conveyed in the unit blocks, respectively, obtaining a residence time until the one substrate is conveyed in each unit block and is then conveyed out; and conveying the one substrate in the unit block having the shortest residence time and conveying the substrate based on the individual conveying schedules.

17 Claims, 17 Drawing Sheets

COATING AND DEVELOPING APPARATUS, COATING AND DEVELOPING METHOD AND STORAGE MEDIUM

CROSS-REFERENCE TO RELATED APPLICATIONS

This application is based on and claims priority from Japanese Patent Application No. 2013-193025 filed on Sep. 18, 2013 with the Japan Patent Office, the disclosure of which is incorporated herein in its entirety by reference.

TECHNICAL FIELD

The present invention relates to a technology of forming a coating film on a substrate or performing development after exposure by using a plurality of unit blocks which each include plural kinds of processing modules and perform the same processing.

BACKGROUND

In a photoresist process which is one of the semiconductor manufacturing processes, a resist pattern is formed by exposing a resist film obtained by coating resist on a surface of a semiconductor wafer (hereinafter, referred to as a wafer) which is a substrate in a predetermined pattern and then developing the resist film. The processing is performed using a system in which an exposure apparatus is connected to a coating and developing apparatus which coats and develops resist.

The coating and developing apparatus is equipped with plural kinds of processing modules which performs different processings and a plurality of sheets of wafers received in a carrier is sequentially conveyed to each of the processing modules in a predetermined order, and thus accurate processing is performed. Further, to increase the number of sheets which may be processed per unit time, these processing modules are prepared in plural within the coating and developing apparatus.

Meanwhile, in the coating and developing apparatus, there is a case where a conveying schedule representing a relationship between the processing modules to which each wafer is conveyed and a conveying timing is prepared in advance and the conveyance of the wafers is performed based on the conveying schedule (see, e.g., Japanese Patent Application Laid-Open No. 2004-311511: Paragraph 0053, FIG. 7). Even though the plurality of wafers is processed in parallel by the coating and developing apparatus in which the plural kinds of processing modules is equipped, the plurality of wafers may be effectively and stably realized by using the conveying schedule.

SUMMARY

According to an aspect, the present disclosure provides a coating and developing apparatus for forming a coating film including a resist film on a substrate taken out from a carrier in which a plurality of sheets of substrates is received and performing developing on the substrate after exposed. The apparatus includes a plurality of unit blocks each provided with plural kinds of processing modules for forming the coating film on the substrate before exposure or performing the developing on the substrate after exposure and configured to perform the same processing; substrate conveying mechanisms each mounted in each of the plurality of unit blocks and configured to convey the substrate between the plural kinds of processing modules in a predetermined order; a substrate distributing mechanism configured to distribute and convey the substrate between the plurality of unit blocks; and a control unit configured to output a control signal to perform preparing individual conveying schedules in which conveying paths for one substrate to be distributed are arranged according to conditions in each unit block depending on time series when the one substrate is conveyed in each of the plurality of unit blocks, prior to distributing the substrate by the substrate distributing mechanism, obtaining a residence time until the one substrate is conveyed in the unit block and is then conveyed out based on the individual conveying schedules corresponding to each unit block, and conveying the one substrate in the unit block having the shortest residence time and conveying the substrate based on the individual conveying schedules prepared for the unit block by the substrate distributing mechanism.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 12 is a third explanation diagram illustrating the operation condition of the COT layer at the time of processing the wafer.

FIG. 16 is a diagram illustrating an example of the conveying schedule performed in the COT layer based on the employed individual conveying schedules.

DETAILED DESCRIPTION

Figure 1:
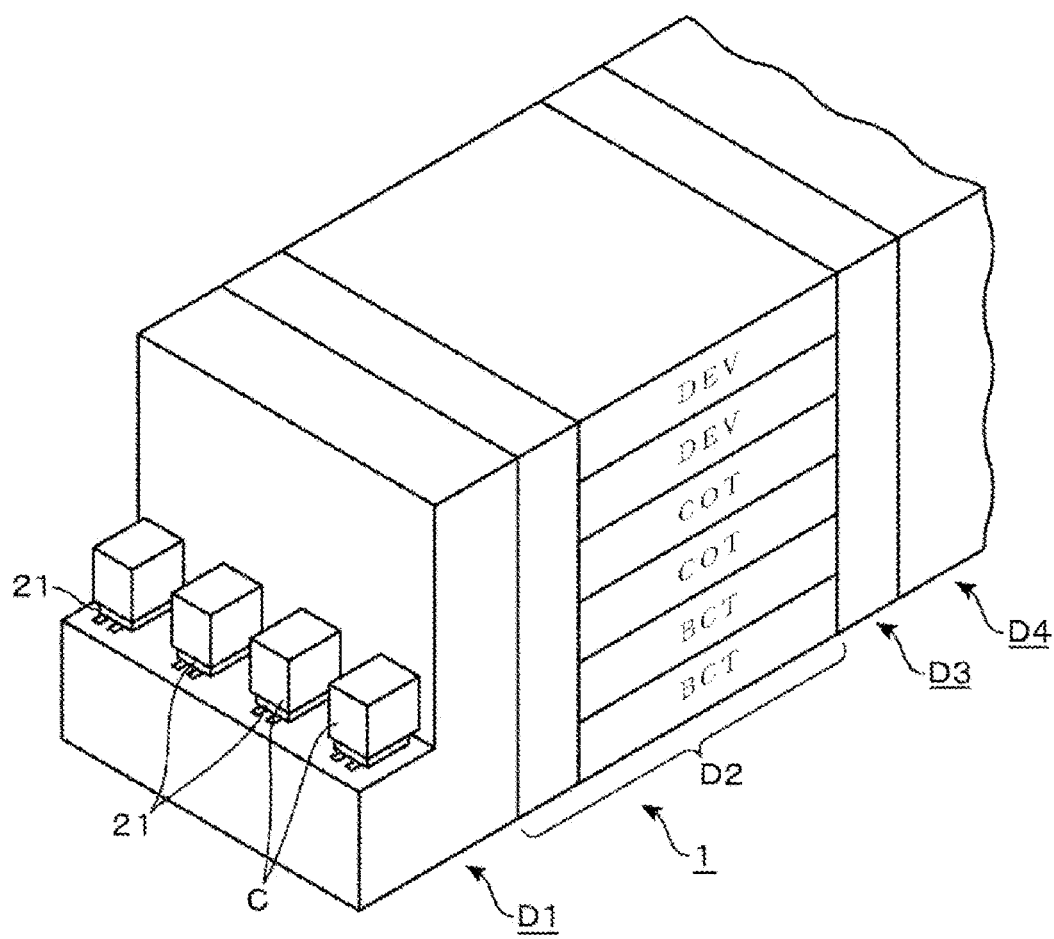
FIG. 1 is an appearance perspective view of a coating and developing apparatus according to an exemplary embodiment of the present invention.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Meanwhile, in the coating and developing apparatus, trouble occurs or a lot is changed while the wafers within the carrier are processed, and therefore some of the processing modules may not be used. In this case, when the plural kinds of the wafers is controlled based on the conveying schedule prepared in advance, a new conveying schedule reflecting a change in processing contents due to the occurrence of the trouble or the change in the lot needs to be prepared. Further, the wafers which suffer from the conveying control using an old conveying schedule and are processed halfway remain within the coating and developing apparatus and are difficult to be switched to the conveying control using the new conveying schedule.

An object of the present invention is to provide a coating and developing apparatus capable of flexibly changing a conveying schedule, a coating and developing method, and a storage medium storing the method.

According to an aspect, the present disclosure provides a coating and developing apparatus for forming a coating film including a resist film on a substrate taken out from a carrier in which a plurality of sheets of substrates is received and performing developing on the substrate after exposed. The apparatus includes a plurality of unit blocks each provided with plural kinds of processing modules for forming the coating film on the substrate before exposure or performing the developing on the substrate after exposure and configured to perform the same processing; substrate conveying mechanisms each mounted in each of the plurality of unit blocks and configured to convey the substrate between the plural kinds of processing modules in a predetermined order; a substrate distributing mechanism configured to distribute and convey the substrate between the plurality of unit blocks; and a control unit configured to output a control signal to perform preparing individual conveying schedules in which conveying paths for one substrate to be distributed are arranged according to conditions in each unit block depending on time series when the one substrate is conveyed in each of the plurality of unit blocks, prior to distributing the substrate by the substrate distributing mechanism, obtaining a residence time until the one substrate is conveyed in the unit block and is then conveyed out based on the individual conveying schedules corresponding to each unit block, and conveying the one substrate in the unit block having the shortest residence time and conveying the substrate based on the individual conveying schedules prepared for the unit block by the substrate distributing mechanism.

The above described coating and developing apparatus may include configurations as follows.

The plural kinds of processing modules includes a liquid processing module configured to coat a coating liquid on the substrate before exposure or supplying a developer to the substrate after exposure and a heating module configured to heat the substrate, and the liquid processing module and the heating module each are configured to be selected among the same processing modules prepared in plural.

The substrate conveying mechanism acquires the substrate from the processing module at an upstream side and includes a first substrate support and a second substrate support to exchange the substrate with a substrate in the processing module at a downstream side.

Other processing modules outside the unit blocks are provided and the substrates in the carrier are conveyed in a predetermined order to the processing module in the unit block and other processing modules and are processed, and the control unit outputs the control signal to perform preparing all the conveying schedules, in which the conveying paths of the substrates for the processing modules in the unit blocks and other processing modules for each substrate in the carrier are arranged depending on the time series, in advance, and when the one substrate is conveyed in the unit block having the shortest residence time, conveying the substrate based on the individual conveying schedules for the unit block having the shortest residence time instead of the conveying schedules of the unit blocks included in all the conveying schedules.

The plurality of unit blocks is mounted in plural groups and the substrates in the carrier are conveyed in a predetermined order to the unit blocks of each group and are processed, thereby performing a series of different processings, and the control unit outputs the control signal to perform the respective steps for each unit block of each group.

The plurality of unit blocks is vertically stacked.

According to another aspect, the present disclosure provides a coating and developing method for forming a coating film including a resist film on a substrate taken out from a carrier in which a plurality of sheets of substrates is received and performing developing on the substrate after exposure. The method includes forming the coating film on the substrate before exposure or performing the developing on the substrate after exposure and performing the same processing by using a plurality of unit blocks each including plural kinds of processing modules, preparing individual conveying schedules in which conveying paths for one substrate to be distributed are arranged according to conditions in each unit block depending on time series when the one substrate is conveyed in each of the plurality of unit blocks prior to distributing the substrate between the plurality of unit blocks and conveying in the distributed substrate; obtaining residence time until the one substrate is conveyed in the unit block and is then conveyed out based on the individual conveying schedules corresponding to each unit block; and conveying the one substrate in the unit block having the shortest residence time and conveying the substrate based on the individual conveying schedules prepared for the unit blocks.

The plural kinds of processing modules includes a liquid processing module configured to coat a coating liquid on the substrate before exposure or supplying a developer to the substrate after exposure and a heating module configured to heat the substrate and the liquid processing module, and the heating module each are configured to be selected from the same processing modules prepared in plural.

The substrates within the carrier are conveyed in a predetermined order to the processing module in the unit block and other processing modules outside the unit block and are processed. The coating and developing method includes: preparing all the conveying schedules, in which the conveying paths of the substrates for the processing modules in the unit block and other processing modules for each substrate in the carrier are arranged depending on the time series, in advance; and when the one substrate is conveyed in the unit block having the shortest residence time, conveying the substrate based on the individual conveying schedules for the unit block having the shortest residence time instead of the conveying schedules of the unit block included in all the conveying schedules.

The plurality of unit blocks is used in a plurality of groups and the substrates within the carrier are conveyed in a predetermined order to the unit blocks of each group and are processed, thereby performing a series of different processings, and the respective steps are performed for each unit block of each group.

A storage medium storing a computer program used in a coating and developing apparatus which forms a coating film including a resist film on a substrate and performs developing on the substrate after exposure, wherein the program includes a combination of steps performing the coating and developing method.

According to the exemplary embodiments of the present invention, when the substrate is conveyed in any one of the plurality of unit blocks to which the kind of processing modules is common and is then processed, the individual conveying schedules are prepared when the substrates are conveyed in each unit block and the unit block in which the residence time of the substrates is shortest is selected based on the prepared conveying schedule, thereby flexibly and efficiently conveying the substrates depending on the operation conditions of each unit block.

A configuration of a coating and developing apparatus 1 to which the present invention is applied will be described with reference to FIGS. 1 to 4. As illustrated in FIG. 1, a coating and developing apparatus 1 of the present example includes a carrier block D1, a processing block D2, and an interface block D3 which are connected to one another in a straight shape. An exposure device D4 is also connected to the interface block D3. Hereinafter, an example in which an arrangement direction of the blocks D1 to D3 is defined as a horizontal direction and one end side at which the carrier block D1 is disposed is defined as a front side will be described.

Figure 2:
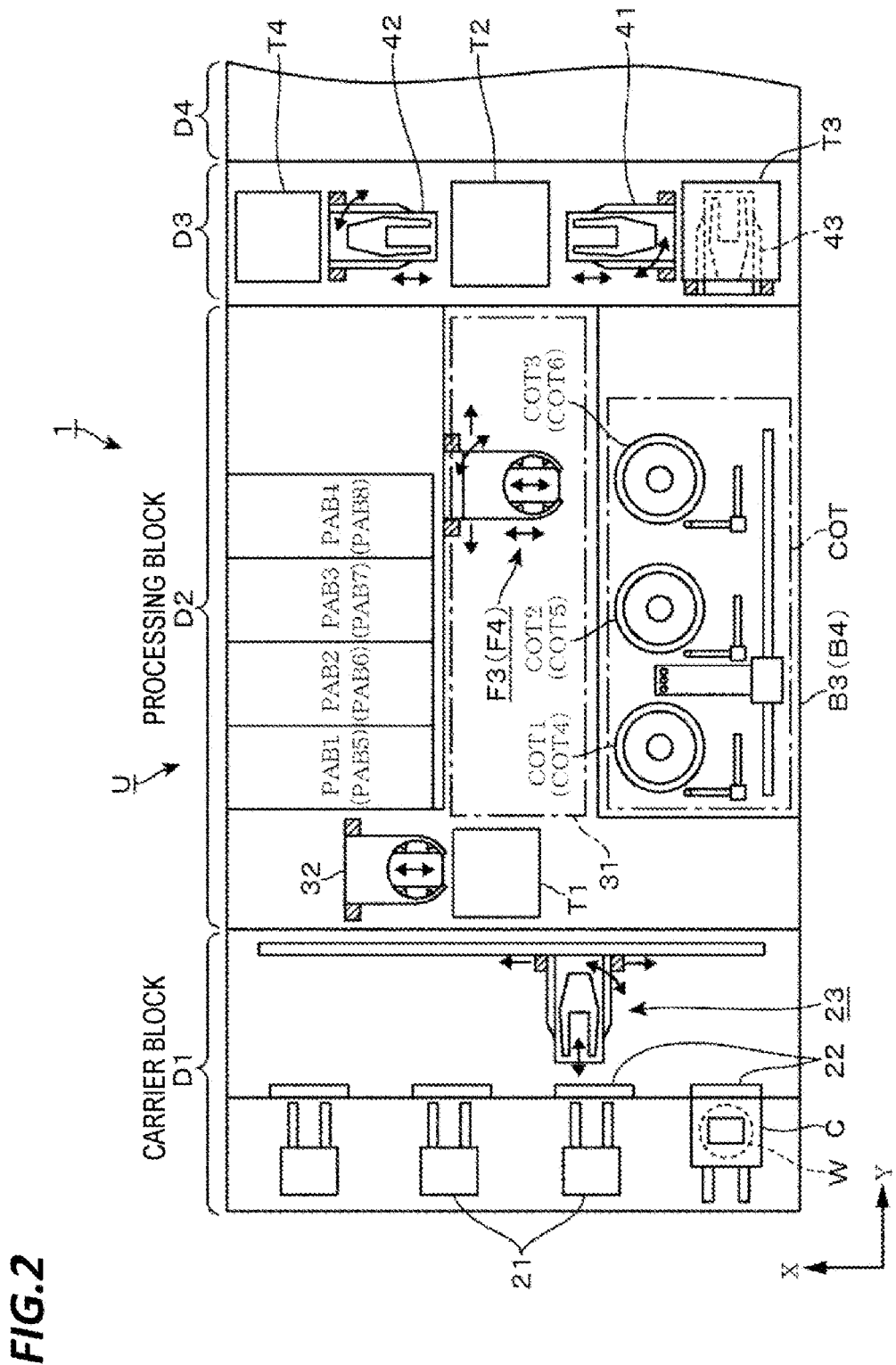
FIG. 2 is a cross section plan view of the coating and developing apparatus.

The carrier block D1 serves to convey-in and out a plurality of sheets of wafers W having the same lot between a carrier C formed of a front opening unified pod (FOUP) in which the wafers W are received and the coating and developing apparatus 1. As illustrated in FIG. 2, the carrier block D1 includes a mounting stand 21 of the carrier C, an opening and closing part 22 opening and closing a cover of the carrier C, and a conveying arm 23 taking out and conveying the wafer W from the carrier C.

Figure 3:
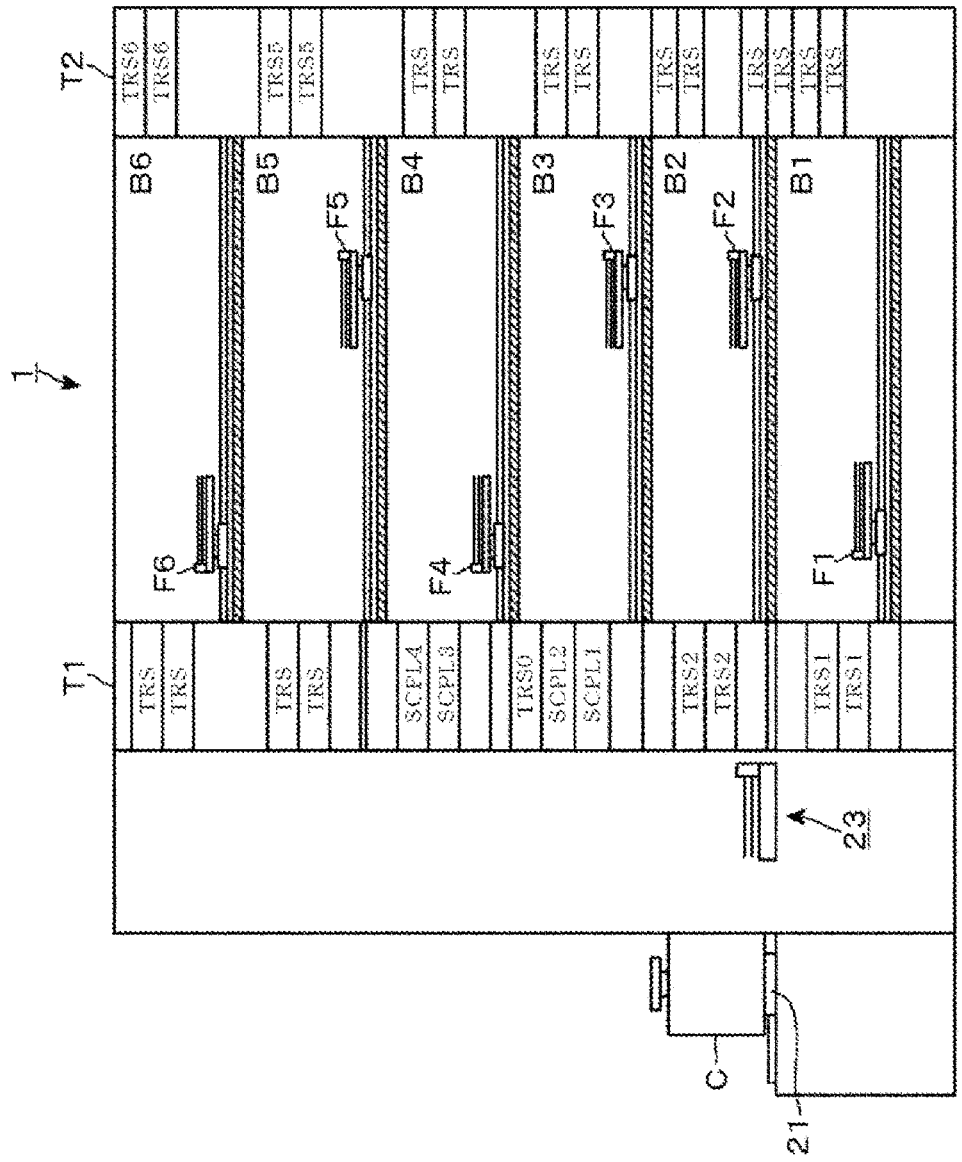
FIG. 3 is a vertical section side view of the coating and developing apparatus.
Figure 4:
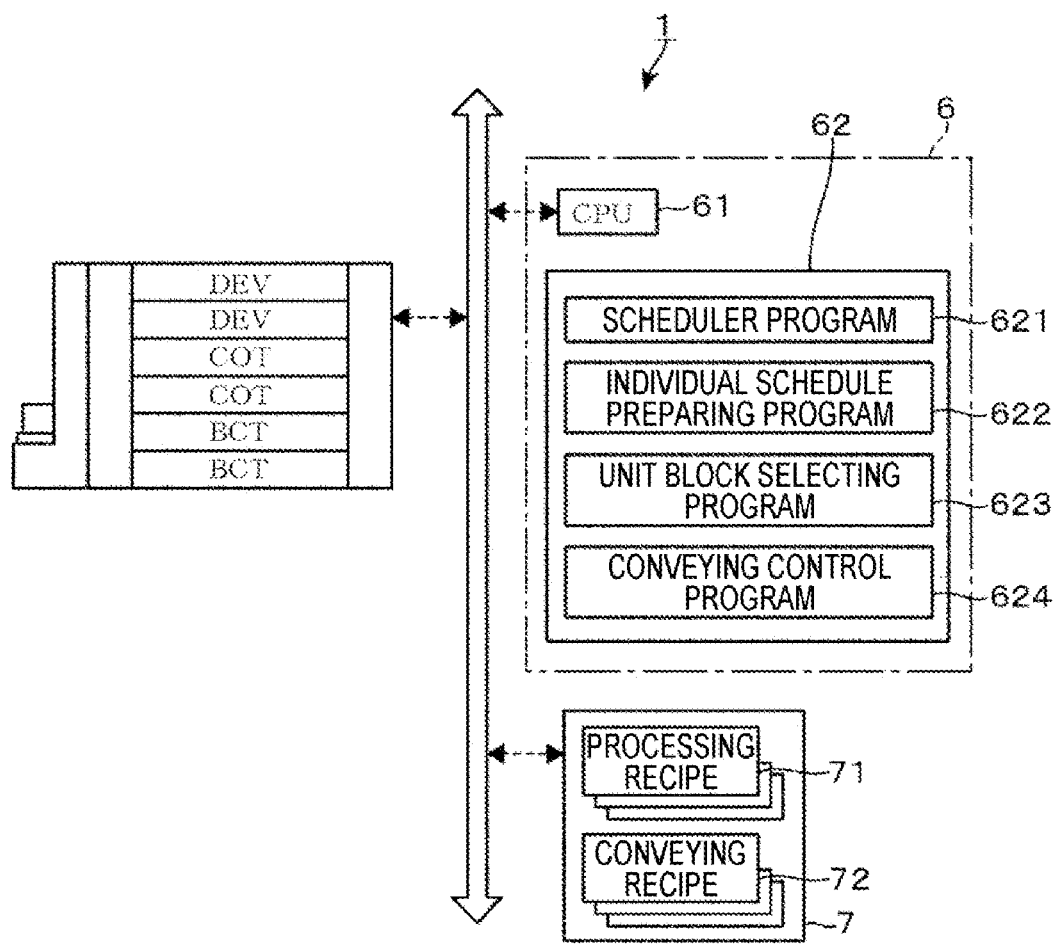
FIG. 4 is a block diagram illustrating an electrical configuration of the coating and developing apparatus.

As illustrated in FIGS. 1 and 3, the processing block D2 is stacked with first to sixth unit blocks B1 to B6 performing liquid processing on the wafer W in order from below. For convenience of explanation, a processing to form an antireflection film on a lower layer of the wafer W, a processing to form a resist film on the wafer W, and a processing to form a resist pattern on the exposed wafer W are each represented by "BCT", "COT", and "DEV" and there is a case in which unit blocks B1 to B6 are represented by BCT layers B1 and B2, COT layers B3 and B4, and DEV layers B5 and B6. According to the present example, the BCT layers B1 and B2, the COT layers B3 and B4, and the DEV layers B5 and B6 are stacked two by two layers from below. In the same kind of unit blocks, the wafers W are conveyed and processed in parallel.

As representative one of these unit blocks, FIG. 2 illustrates the COT layer B3 (B4). The COT layer B3 (B4) is formed with a conveying region 31 extending in a direction from the carrier block D1 toward the interface block D3 and the conveying region 31 is provided with the conveying arm F3 (F4). The conveying arm F3 (F4) corresponds to a substrate conveying mechanism of the present example and accepts the wafer W from a processing module at an upstream side within the COT layer B3 (B4) and includes two sheets of forks (a first substrate support and a second substrate support) which exchange the accepted wafer W with a wafer W within a processing module at a downstream side.

At one side (for example, left when viewed from the front) of the conveying region 31, heating modules PAB1 to PAB4 (PAB5 to PAB8), which are configured of a plurality of shelf units U and are a processing module performing a heating processing after the resist film is coated, are disposed horizontally in parallel. Further, at the other side (for example, right when viewed from the front) of the conveying region 31, resist film forming modules COT1 to COT3 (COT4 to COT6), which are a liquid processing module supplying various kinds of chemicals including a resist liquid (coating liquid) to the surface of the rotating wafer W to perform the liquid processing, are disposed horizontally in parallel.

In the present specification, a place where the wafer W is disposed within the coating and developing apparatus 1 is referred to as a module and a place where a processing is performed on the disposed wafer W is referred to as the processing module.

Other unit blocks B1, B2, B5, and B6 are configured to be substantially the same as the unit blocks B3 and B4, except that the chemicals supplied to the wafer W are different. The unit blocks B1 and B2 are the liquid processing modules and include an antireflection film forming module supplying a coating liquid for forming the antireflection film instead of the resist film forming module (COT) and the unit blocks B5 and B6 include a developing module supplying a developer. FIG. 3 illustrates that the conveying arms of the unit blocks B1 to B6 are represented by F1 to F6.

These unit blocks B1 to B6 each include the plural kinds of processing modules (for example, the COT layer B3 (B4) includes the heating module PAB and the resist film forming module (COT)).

The front side of the processing block D2 is provided with a tower T1 which vertically extends over each unit block B1 to B6 and an elevatable transfer arm 32 which performs a transfer of the wafer W between the plurality of modules mounted in the tower T1. The transfer arm 32 serves as a substrate distributing mechanism for distributing the wafers W and conveying-in the wafers W in the unit blocks B3 and B4.

The tower T1 is vertically stacked with the plurality of modules and among these modules, transfer modules TRS mounted to correspond to heights of the unit blocks B1 to B6 are used to perform the transfer of the wafers W among the conveying arms F1 to F6 within the unit blocks B1 to B6.

In a detailed example of the module mounted in the tower T1, as the foregoing transfer modules TRS used to transfer the wafers W among the respective unit blocks B1 to B6, there are a temperature control module (CPL) which controls a temperature of the wafer W, a buffer module (BU) which temporarily stores the plurality sheets of wafers W, and a hydrophobic processing module (ADH) which performs a hydrophobic processing on the surface of the wafer W. To simplify the description, the hydrophobic processing module (ADH), the temperature control module (CPL), and the buffer module (BU) are not partially illustrated.

According to the exemplary embodiment of the present invention, the transfer module TRS used to transfer the wafer W between the tower T1 and the unit blocks B3 and B4 (COT layers B3 and B4) serves as the temperature control module (CPL) which is the processing module. In FIG. 3, the temperature control modules (CPL) performing the transfer and the temperature control of the wafer W between the COT layers B3 (B4) each are represented by "SCPL1 and SCPL2 (SCPL3 and SCPL4)". In the viewpoint of distributing the wafers W and conveying the wafers W in the COT layer, these temperature control modules "SCPL1 and SCPL2 (SCPL3 and SCPL4)" configure the unit block which is common with resist film forming modules COT1 to COT3 (COT4 to COT6) and the heating modules PAB1 to PAB4 (PAB5 to PAB8) within the COT layer B3 (B4).

As illustrated in FIGS. 2 and 3, the interface block D3 includes towers T2, T3, and t4 which vertically extend over each unit block B1 to B6. The interface block D3 is provided with an elevatable interface arm 41 which performs the transfer of the wafer W between the tower T2 and the tower T3, an elevatable interface arm 42 which performs the transfer of the wafer W between the tower T2 and the tower T4, and an interface arm 43 which performs the transfer of the wafer W between the tower T2 and the exposure apparatus D4.

The tower T2 is configured to be stacked with the transfer module TRS, the buffer module BU which stores and makes residence the plurality of sheets of none-exposed wafers W, the buffer module BU which stores the plurality of sheets of exposed wafers W, the temperature control module CPL which controls the temperature of the wafer W, and the like, but similar to the case of the tower T1, the buffer module BU and the temperature control module CPL are not illustrated.

The tower T3 disposed at the right of the tower T2 when viewed from the front is vertically stacked with a plurality of exposed washing modules PIR which washes the exposed wafer W. Meanwhile, the tower T4 disposed at the left of the tower T2 is vertically stacked with a plurality of back washing modules BST which washes a back surface of the wafer W prior to being conveyed in the exposure apparatus D4. The description of the modules will be omitted.

The coating and developing apparatus 1 having the foregoing configuration includes a computer having a control unit 6 and a memory 7. The control unit 6 is configured of a central processing unit (CPU) 61 and a program storage unit 62, in which the program storage unit 62 is recorded with programs formed of a combination of step (command) groups for a control associated with operations of each coating and developing apparatus 1, that is, operations of taking out the wafer W from a carrier C and allowing each unit block B1 to B6 to process the wafers W while conveying the wafers W along a conveying path, and storing the processed wafers W within the carrier C. These programs are stored in storage media such as a hard disk, a compact disk, a magnet optical disk, a memory card and are mounted in a computer therefrom. Meanwhile, in FIG. 4, the program storage unit 62 and the memory 7 to be described below are described as respective storage media, but may be configured of a common storage medium.

Herein, the coating and developing apparatus 1 according to the exemplary embodiment of the present invention includes a function of performing the conveying control of the wafer W based on all the conveying schedules for all the modules used to convey and process the wafers W stored within the carrier C. Further, for some of the unit blocks (COT layers B3 and B4 and temperature control modules SCPL1 to SCPL4), each time the individual wafer W is conveyed-in, the conveying control of the wafer W is performed based on the individual conveying schedules for each unit block so that the unit blocks B3 and B4 in which the residence time of the wafer W is short may be selected as conveying destinations.

Meanwhile, in the description of the selection of the unit blocks B3 and B4 which are the conveying destinations of the wafers W, it is assumed that the temperature control modules SCPL1 and SCPL2 are included in the COT layer B3 and the temperature control modules SCPL3 and SCPL4 are included in the COT layer B4.

As described above, for performing the conveying control, the program storage unit 62 according to the exemplary embodiment of the present invention includes a scheduler program 621 preparing all the conveying schedulers of the coating and developing apparatus 1 in which the conveying destinations and a conveying order (that is, the conveying path of each wafer W) of each wafer W within the carrier C are arranged depending on time series, individual schedule preparing programs 622 preparing individual conveying schedules in which the conveying path of each wafer W for the individual COT layers B3 and B4 is arranged depending on time series when the processing of each wafer W is performed in the COT layers B3 and B4, a unit block selecting program 623 selecting the COT layers B3 and B4 in which the residence time of the wafer W is shortest as a conveying-in destination of the wafer W, based on the individual conveying schedule prepared for each COT layer B3 and B4, and a conveying control program 624 operating a conveying mechanism of the wafer based on each conveying schedule prepared by the scheduler program 621 or the individual schedule preparing program 622 to perform the conveying control of the wafer W.

As data for preparing the conveying schedule of the wafer W, the memory 7 is stored with a conveying recipe 72 and a processing recipe 71. The conveying recipe 72 is set with information for setting the conveying path along which the wafer W conveyed out from the carrier C is processed by the coating and developing apparatus 1 and the exposure apparatus D4 and is then conveyed in the original carrier C. When the same kind of module is mounted in plural, the conveying destinations may be selected by identifying each module and all the conveying schedules of the coating and developing apparatus 1 may be prepared. Further, the conveying paths within the COT layers B3 and B4 which are set in the conveying recipe 72 may also be used to prepare the individual conveying schedules.

The processing recipe 71 is set with information about contents of processing performed in each processing module (for example, in the case of the liquid processing module, a rotating speed of the wafer W, a supply time of the chemicals, or the like and in the case of the heating module or the temperature control module (CPL), a temperature setting value, a temperature control time, or the like). The processing recipe 71 may be selected from plural kinds depending on the information set in the wafers W within the carrier C.

Meanwhile, the wafers W within the carrier C which are conveyed from a factory and are processed by each processing apparatus are beforehand set with the contents of processings which are performed by the coating and developing apparatus 1 and the exposure apparatus D4. As the information for managing the processing contents, the wafers W within the carrier C are set with control jobs (CJ) and process jobs (PJ). The CJ is a group unit of the PJs set for each wafer W and in the present example, is set for each lot. The PJ is set with information, and the like which specifies the processing recipes performed on each wafer W.

For example, each carrier C has a configuration in which 25-stage slots keeping the wafer W at a horizontal posture are stacked to be overlapped vertically. The CJ includes IDs which are individual numbers of each CJ and information specifying the carrier C in which the CJs having the IDs are set.

Each CJ may be set with the plurality of PJs, in which the PJ includes the IDs which are individual numbers of the PJs and the information (for example, corresponding to a sign of "A01, A02, . . . " of the conveying schedule illustrated in FIG. 7) specifying the wafer W in which the PJs having the IDs are set or the information specifying the performed processing recipe 71. The wafer W in which each PJ is performed is specified by positions of the slots of the carrier C.

The information about these CJs or PJs is individually set for each carrier C or the wafers W stored therein and the control unit 6 acquires the information by communication with a host computer which manages apparatuses within a factor.

An operation of the coating and developing apparatus 1 configured as described above will be described. First, an outline of the processing performed by using the coating and developing apparatus 1 will be described.

The wafer W is conveyed out one by one sheet for each lot from the carrier C and is conveyed to a transfer module TRS0 of the tower T1 in the processing block D2 by the conveying arm 23. The wafer W of the transfer module TRS0 is distributed into the BCT layers B1 and B2 through transfer modules TRS1 and TRS2 by the transfer arm 32.

The wafer W conveyed in the BCT layers B1 and B2 is processed while being conveyed in order of antireflection film forming module→heating module→TRS1 (TRS2) and then suffers from the temperature control by the temperature control modules SCPL1 to SCPL4 and then is distributed into the COT layers B3 and B4 by the transfer arm 32.

The wafer W conveyed in the COT layers B3 and B4 is processed while being conveyed in order of resist film forming module→heating module→transfer module TRS of the tower T2.

The wafer W conveyed in the transfer module TRS of the tower T2 is conveyed in a buffer module SBU (not illustrated) and then is conveyed in a back washing module BST of the tower T4 by the interface arm 42, thereby washing the back surface. The wafer W of which the back surface is washed is conveyed in the exposure apparatus D4 through the temperature control module CPL (not illustrated) of the tower T2 by each interface arm 42, 41, and 43.

The exposed wafer W is conveyed in the exposed washing module PIR of the transfer module TRS of the tower T2→the exposed washing module PIR of the tower T3 by the interface arms 43 and 41 and after being washed, is distributed into the DEV layers B5 and B6 through the transfer modules TRS5 and TRS6 of the tower T2. The wafer W conveyed in the DEV layer B5 or B6 is processed while being conveyed in order of heating module→developing module→heating module→transfer module TRS of the tower T1 and returns to the carrier C through the transfer arm 23.

When the foregoing processing is performed on each wafer W within the carrier C, the contents of the conveying control conveying the wafer W to each module will be described with reference to FIGS. 5 to 16.

First, when the carrier C receiving the wafer W to be processed is disposed on a mounting stand 21 of the carrier block D1 (start of FIG. 5), the control unit 6 acquires the information CJ and PJ about the processing of the wafer W from the external host computer. The control unit 6 selects the processing recipe 71 performed on the wafer W based on the information set in the PJ and selects the processing module which may perform the processing set in the processing recipe 71. Further, the control unit 6 includes these processing modules and selects the conveying recipe 72 including the transfer module TRS, the buffer module BU, or the like through which the wafer W passes until the wafer W is conveyed in each processing module and determines the conveying path of each wafer W based on the conveying recipe 72.

Figure 5:
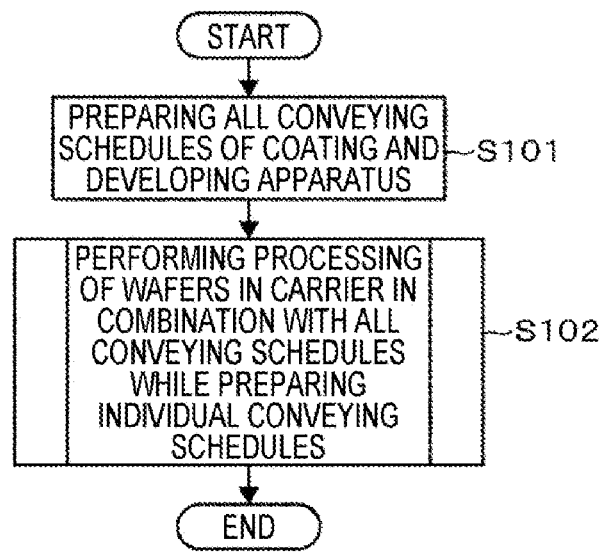
FIG. 5 is a flow chart illustrating an operation of the coating and developing apparatus.
Figure 7:
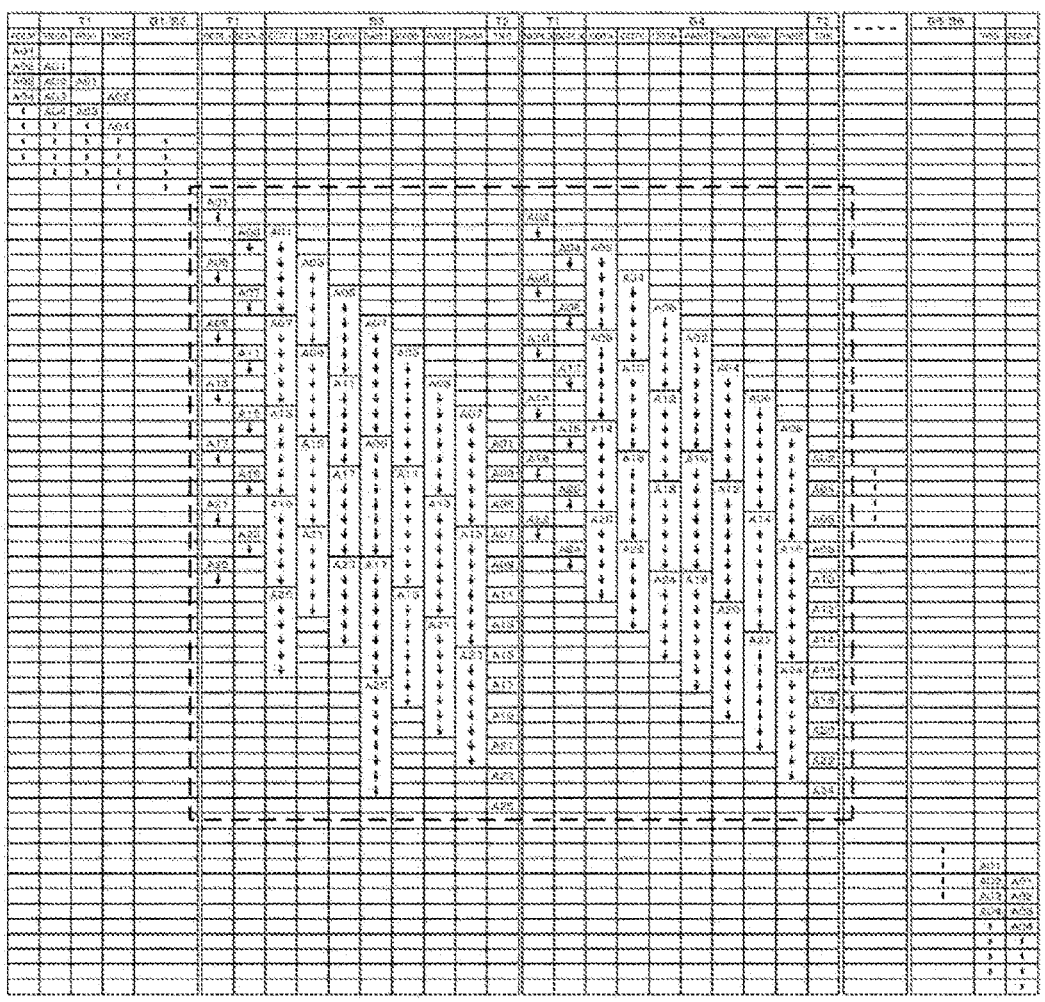
FIG. 7 is an explanation diagram illustrating an outline of all the conveying schedules of the coating and developing apparatus.

By doing so, when the conveying path for the wafer W within the lot is determined and the conveying destination and the conveying order of each wafer W are arranged with the passage of time, as schematically illustrated in FIG. 7, all the conveying schedules of the coating and developing apparatus 1 for the lot are prepared (step S101 of FIG. 5).

Here, in each conveying schedule illustrated in FIGS. 7 to 16, horizontal columns represent the modules which are the conveying destinations, vertical rows represent respective conveying steps, and identification codes of the wafers W disposed in respective modules are described in the columns. The conveying step of the present example proceeds toward the row at the lower portion in a unit of 10 seconds.

Here, for the conveying control of the wafer W in the COT layers B3 and B4 (including the temperature control modules SCPL1 to SCPL4 of the tower T1. The same as below), the coating and developing apparatus 1 according to the exemplary embodiment of the present invention determines the optimal conveying-in designation at the time of conveying-in each wafer W without using all the conveying schedules prepared in advance. For this reason, among all the conveying schedules illustrated in FIG. 7, portions of the conveying schedules of the COT layers B3 and B4 enclosed by a dotted line serve as a simulated conveying schedule for preparing the conveying schedules in each module of a later stage than the COT layers B3 and B4.

When all the conveying schedules of the coating and developing apparatus 1 are prepared, the wafers W are conveyed based on all the conveying schedules and the processing of the wafers W is performed in each processing module. Meanwhile, the conveying and processing of the wafers W in the COT layers B3 and B4 are performed based on the individual conveying schedules prepared at the time of the conveyance in of each wafer W (step S102).

Figure 6:
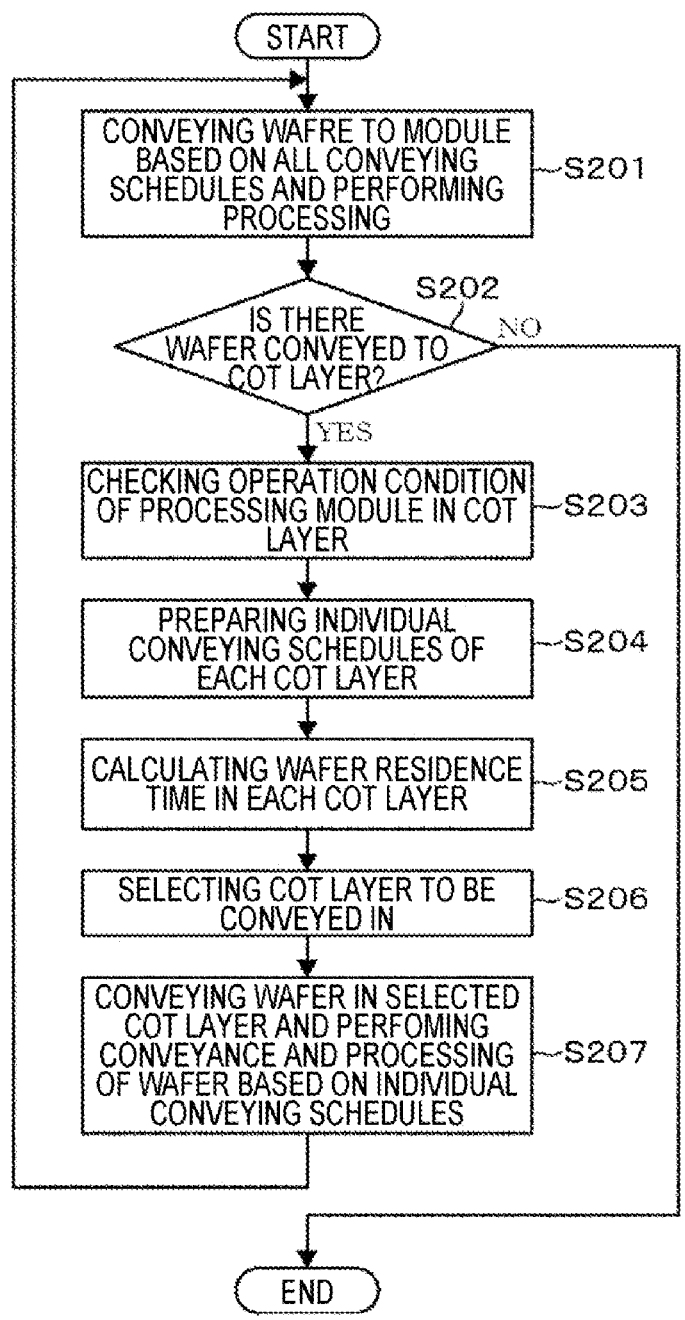
FIG. 6 is a flow chart illustrating an operation of selecting a unit block performing processing of a wafer.

An operation flow of selecting the optimal COT layers B3 and B4 by preparing the individual conveying schedules will be described with reference to FIG. 6.

First, when the processing of the wafer W within the carrier starts, the wafer W is conveyed based on all the conveying schedules prepared in advance and the processing is performed in each processing module (step S201).

When there is the wafers W conveyed in the COT layers B3 and B4 (step S202; YES), the operation conditions of the processing modules (SCPL1 to 4, the resist film forming modules COT1 to COT6, and the heating modules PAB1 to PAB8) of both COT layers B3 and B4 are checked (step S203). As the detailed example of the operation conditions to be checked, there may be the use conditions of the processing modules or information on whether the processing set in the processing recipe 71 of the wafer W may be performed, and the like.

Subsequently, the individual conveying schedules which may be performed in the COT layers B3 and B4 are prepared based on the acquired operation information, the conveying recipe 72 selected for the wafer W, and the like (step S204). When the individual conveying schedules are prepared, the residence time until the wafers W are conveyed in each COT layer B3 and B4 and then conveyed out is calculated (step S205) and the COT layers B3 and B4 having a short residence time are selected as the conveying-in designation of the wafer W (step S206). Further, the wafers W are conveyed in the selected COT layers B3 and B4 and the conveying-in and processing of the wafers W are performed based on the individual conveying schedules (step S207).

The detailed operation contents from the foregoing operation of acquiring the operation conditions of the COT layers B3 and B4 to the operation of performing the conveying-in and the processing of each wafer W by preparing the individual conveying schedules will be described with reference to FIGS. 8 to 16.

Figure 8:
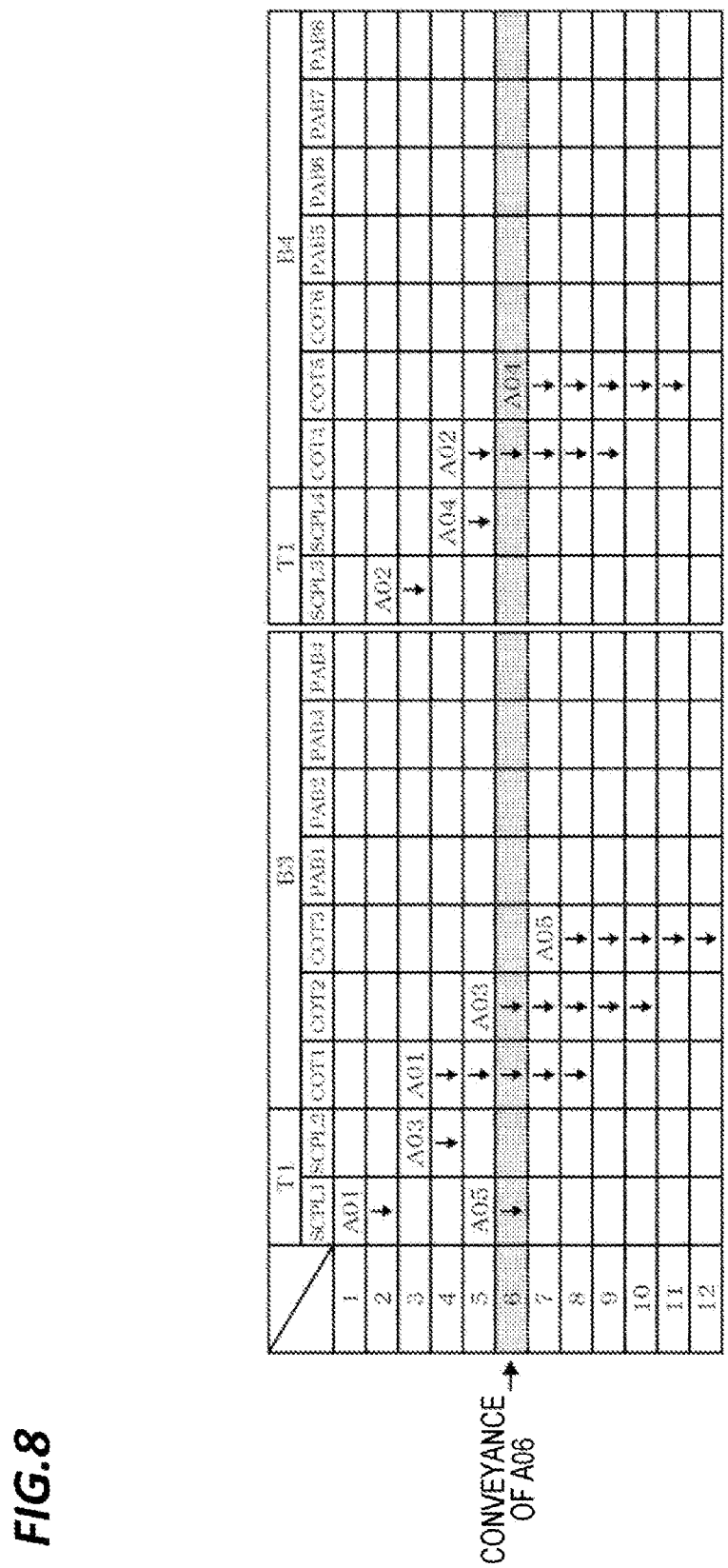
FIG. 8 is a first explanation diagram illustrating an operation condition of a COT layer at the time of processing the wafer.

Hereinafter, as illustrated in FIG. 8, it is assumed that five sheets of wafers W of "A01 to A05" are distributed and then conveyed in the COT layers B3 and B4. In a "conveying step 6" (represented by fully painting the columns described in FIG. 8 with grey color. Hereinafter, the same in FIGS. 10, 12, and 14) immediately after the fifth sheet "A05" is conveyed in the temperature control module SCPL1 at the COT layer B3 side, a case of determining the conveying-in destination of the wafer W of the sixth "A06" is considered.

First, a progress condition of the processing on how long each processing module is occupied by the first conveyed-in wafer W, and the like or the information on whether the processing module which may not be used is present is acquired and the individual schedules are prepared based on these operation conditions.

Figure 9B:
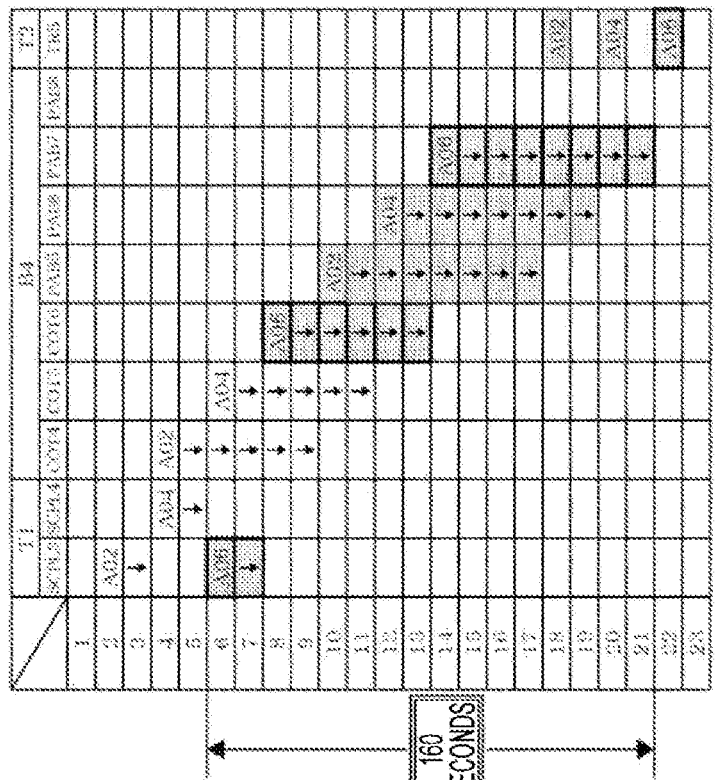
FIGS. 9A & 9B are first explanation diagrams illustrating preparation examples of individual conveying schedules.
Figure 9A:
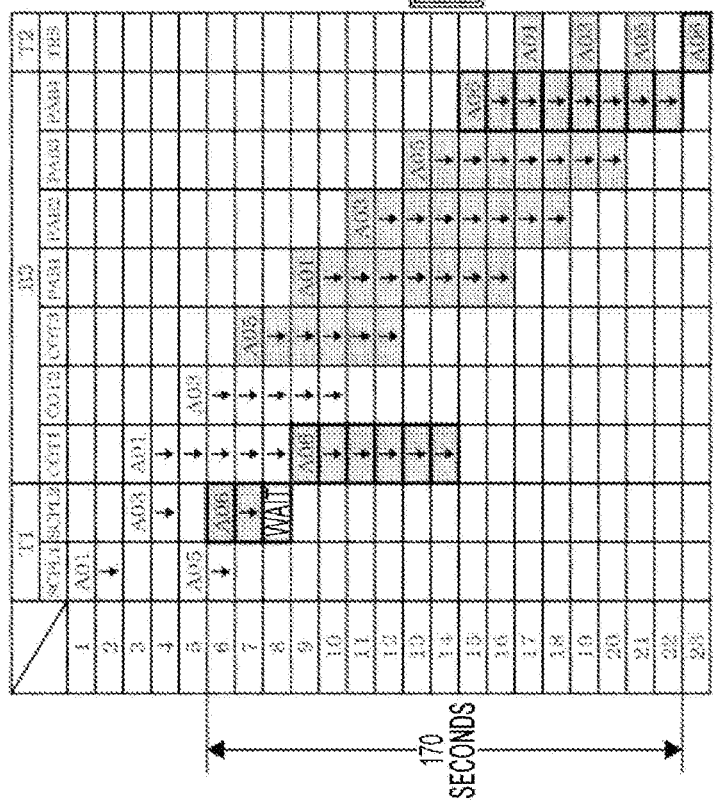

As illustrated in FIGS. 9A and 9B, the individual conveying schedules in the case of conveying-in the wafer W of the "A06" in the "conveying step 6" are prepared for both sides of the COT layers B3 and B4. That is, in the COT layer B3 illustrated in FIG. 9A, after the coating of the resist film to the wafers W of the "A01 and A03" is performed for 60 seconds, these wafers W are sequentially conveyed in the heating modules PAB1 to PAB3 and processed (for 80 seconds) and are conveyed to the transfer module TRS of the tower T2.

The wafer W of the "A05" which suffers from the temperature control by the temperature control module SCPL1 suffers from the temperature control for 20 seconds and then is conveyed in the processing module which may be conveyed-in and the wafer W of the "A05" suffers from the same processing as the preceding wafer W and then is conveyed to the transfer module TRS of the tower T2. Here, for the operation conditions checked in advance, a disposition position of the wafer F in a newly added conveying step in the individual conveying schedule is represented by fully painting the columns with grey color (hereinafter, the same in FIGS. 11, 13, and 15). Further, the processing time in each processing module is represented by way of example, and it is assumed that the conveying operation of the wafer W is sufficiently fast and the waiting time of the processing due to the conveyance is not generated. Further, the time required for the replacement operation of the wafers W in each module is represented by an included number of the processing time.

Meanwhile, when the conveying time of the wafer W becomes rate-determining, it is enough to calculate the residence time by subtracting the time to perform a processing of another wafer W within the processing module in parallel with the conveyance from the time required to convey the wafer W between the processing modules and adding the time (time for the processing module to wait for the conveyance of the wafer W) required for only the conveyance thereto.

As such, when the conveying schedule for the preceding wafer W is prepared, the conveying schedule of the wafer W of the "A06" which is subsequently conveyed-in is also determined. That is, as illustrated in FIG. 9A, after the wafer W is conveyed in the temperature control module SCPL2 in which the processing of the preceding wafer W is not performed, the processing waits for 10 seconds until the resist film forming modules COT1 to COT3 complete the processing of the preceding wafer W. To be continued, after the wafer W is conveyed in the earliest processed resist film forming module COT1 and is coated with the resist film, the wafer W is conveyed in the heating processing module PAB4 which does not yet start the processing and suffers from the heating processing. As the result, the residence time of the wafer W of the "A06" from being conveyed in the temperature control module SCPL2 to being transferred to the transfer module TRS of the tower T2 is specified to be 170 seconds.

In each of FIGS. 9, 11, 13, and 15, disposition positions of newly conveyed-in wafers W in each conveying step are represented by fully painting the columns with grey, in which edge lines thereof are represented by bold lines.

Meanwhile, as illustrated in FIG. 9B, the individual conveying schedule for the COT layer B4 of the other side is prepared by the same method. As the result, since there is no waiting time required to convey the wafer W of the "A06" of which the temperature is completely controlled by the temperature control module SCPL3 in the resist film forming module COT6, the residence time of the wafer W of the "A06" in the COT layer B4 is specified to be 160 seconds.

Therefore, the wafer W of the "A06" is conveyed in the COT layer B4 having a short residence time and the conveying control of the preceding "A02 and A04" and the wafer W of the "A06" newly conveyed-in is performed based on the individual conveying schedules of FIG. 9B. Further, in the COT layer B3 of the other side, the conveying control of the wafer F based on the individual conveying schedules prepared when the wafer of the "A05" is conveyed-in is continued.

Meanwhile, when the residence time of both COT layers B3 and B4 obtained by the foregoing method is the same, it is enough to define an upper selection rule such as selecting the COT layers B4 and B3 of an opposite side to the COT layers B3 and B4 in which a wafer W before the previous wafer W is conveyed. Further, at the time of conveying-in the first sheet of wafer W, it is enough to select the COT layers B3 and B4 which are the conveying-in destinations based on all the foregoing conveying schedules.

Figure 10:
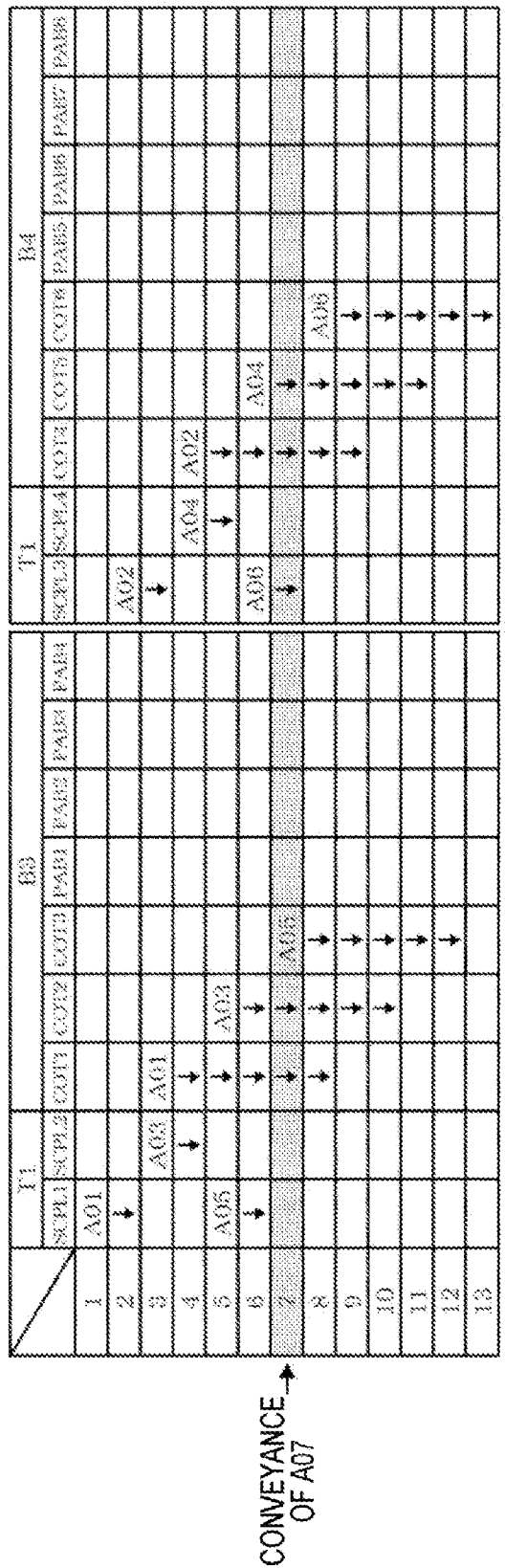
FIG. 10 is a second explanation diagram illustrating an operation condition of the COT layer at the time of processing the wafer.
Figure 11A:
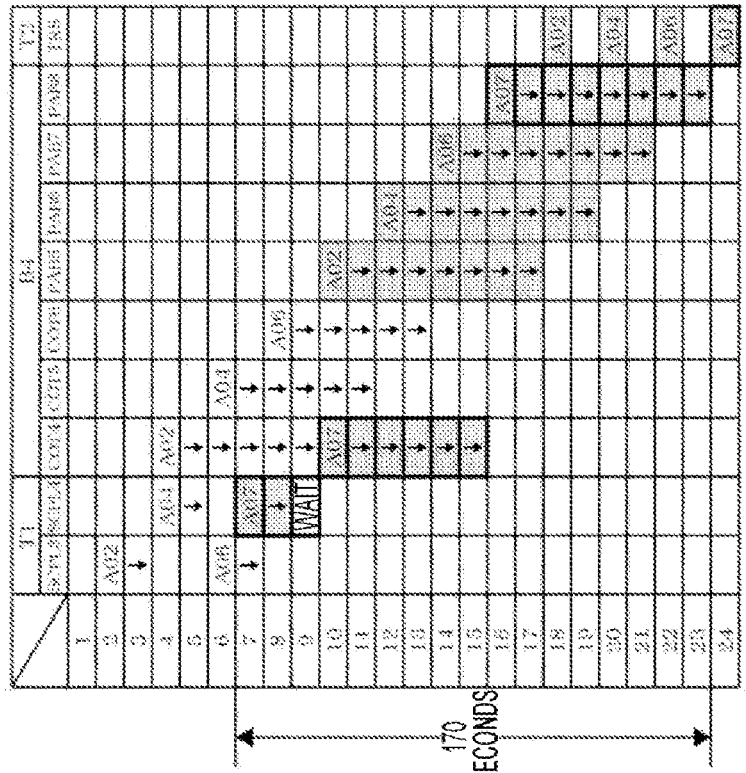
FIGS. 11A & 11B are second explanation diagrams illustrating the preparation examples of the individual conveying schedules.
Figure 11B:
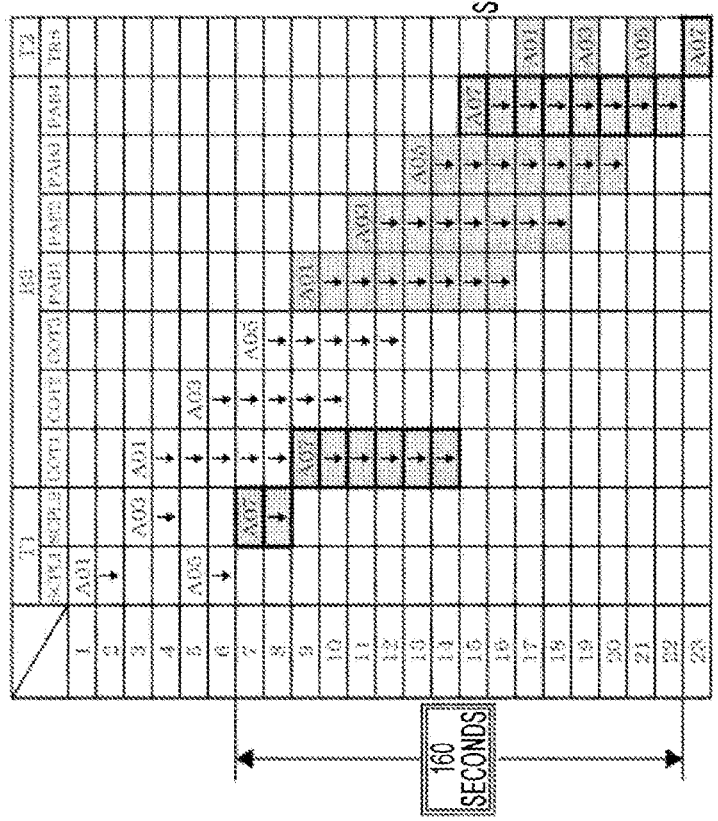

To be continued, as illustrated in FIG. 10 and FIGS. 11A and 11B, the sequential, individual conveying schedules for subsequent wafers W such as a wafer W of "A07" are prepared. Further, when a new wafer W is conveyed-in, the conveying control of the wafers W conveyed in the COT layers B3 and B4 and the processing within each processing module are performed while the individual conveying schedules are updated.

As the result, under the condition that trouble, and the like does not occur at the processing module sides within the COT layers B3 and B4, the simulated conveying schedules enclosed by a dotted line among all the conveying schedules of FIG. 7 are realized by distributing the wafers W into the COT layers B3 and B4 based on the individual conveying schedules.

Next, an operation of the case in which some of the processing modules within the COT layers B3 and B4 may be used due to the occurrence of the trouble, and the like while the processing of the wafer W is performed will be described.

To be continued from the state described with reference to FIGS. 8 to 11, FIGS. 12 to 15 illustrate an operation of the case in which the wafer W is conveyed-in in the same order and the resist film forming module COT6 may not be used in "conveying step 14" immediately before a processing of a wafer W of "A12" is performed (immediately after the processing of the wafer W of the "A06" ends).

In the example, by the premise that the resist film forming module COT6 may not be used at the timing at which the processing of the wafer W of the "A06" first processed is not affected, the description of the handling of the wafer W of which the processing stops may be omitted.

When the processing module may not be used during the processing of any wafer W, there is no difference in an operation of determining the conveying-in destination of the wafer W, except for adding an operation of recovering the wafer W of which the processing stops or performing reprocessing.

Figure 12:
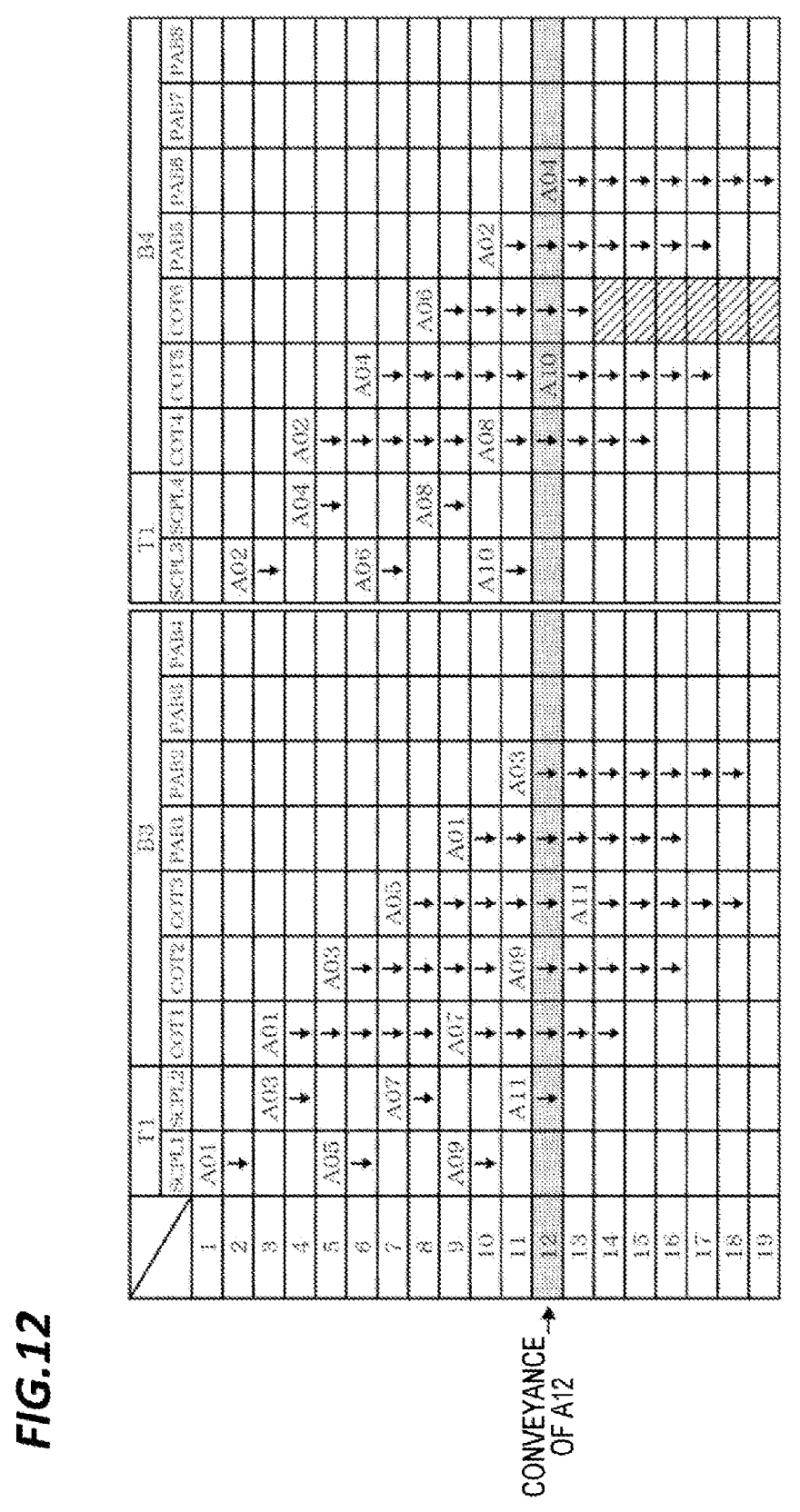

Hereinafter, it is assumed that when a conveying-in destination of a wafer W of an "A12" illustrated in FIG. 12 is determined, based on the result of acquiring the operation information, it is known that the resist film forming module COT6 of the COT layer B4 may not be used at the timing of the "conveying step 14" after the processing of the "A06" is completed, due to, for example, a lack of a processing liquid, and the like. In FIG. 12, the state in which the resist film forming module COT6 may not be used is represented by an oblique hatch (the same in FIGS. 13B, 14, 15B, and 16).

Figure 13A:
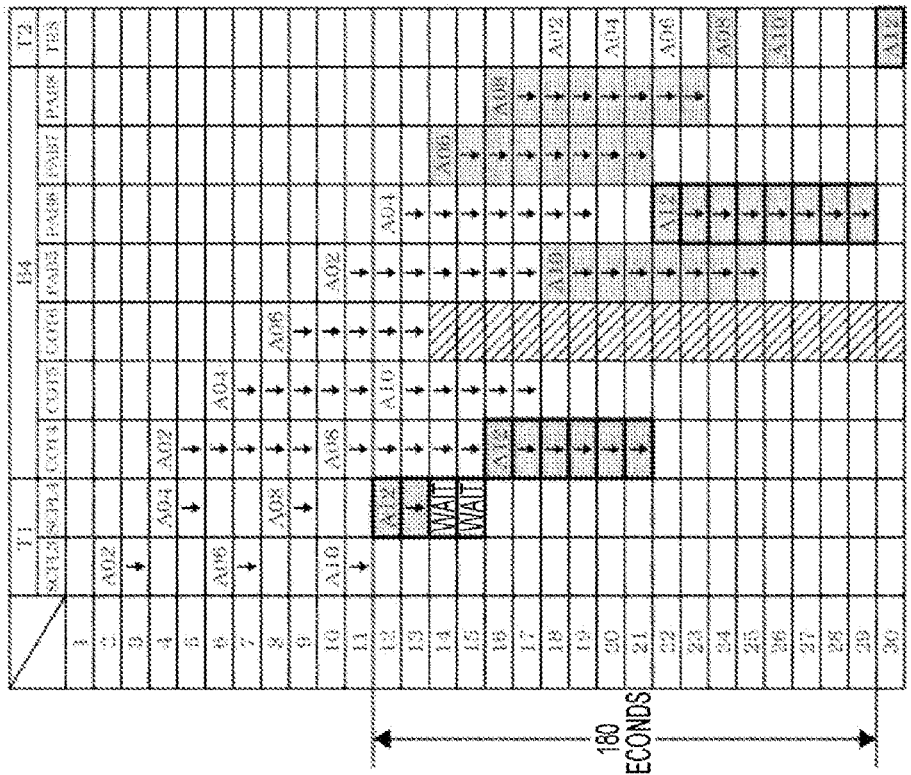
FIGS. 13A & 13B are third explanation diagrams illustrating the preparation examples of the individual conveying schedules.
Figure 13B:
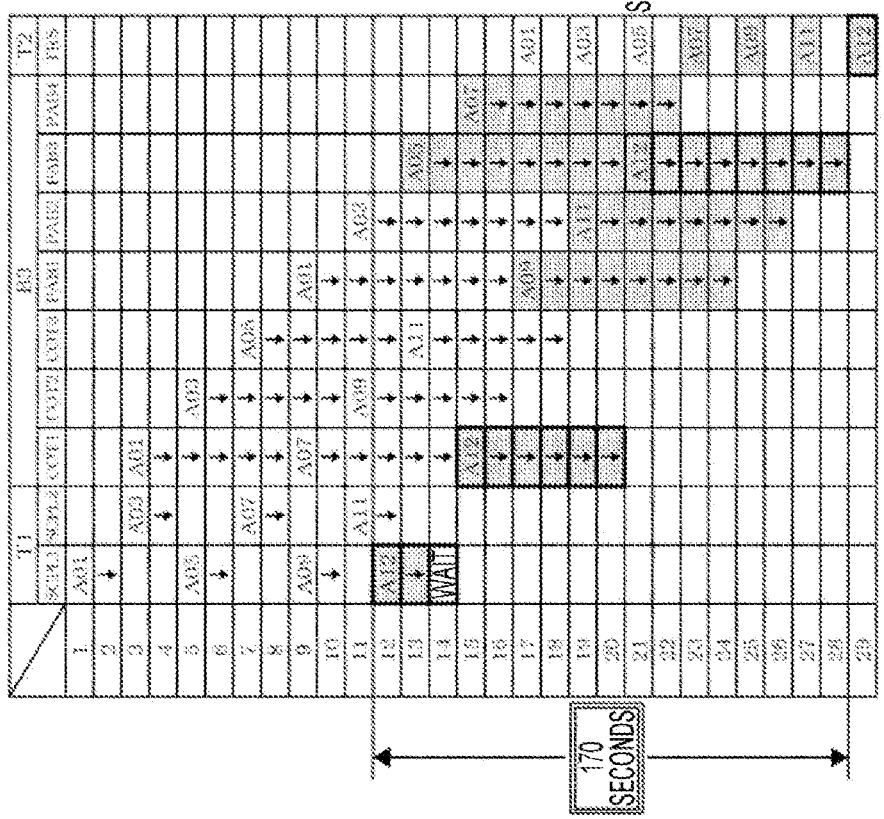

Even in this case, similar to the forgoing example, the individual conveying schedules in the case in which the wafer W of the "A12" is conveyed in both COT layers B3 and B4 are prepared based on the result of acquiring the operation conditions. As the result, the residence time of the wafer W of the "A12" in the COT layer B3 is 170 seconds (FIG. 13A).

Meanwhile, when the wafer W of the "A12" is conveyed in the COT layer B3 in which the resist film forming module COT6 may not be used, the temperature control module SCPL4 performs the temperature control and a waiting time of 20 seconds is generated until the resist film forming module COT4 may start the processing of the wafer W. As the result, the residence time of the wafer W of the "A12" in the COT layer B4 is 180 seconds (FIG. 13A) and the COT layer B3 having a short residence time is selected as the conveying-in destination of the wafer W. Therefore, the wafers W of the "A11 and A12" are continuously conveyed in the COT layer B3. Meanwhile, as illustrated in FIG. 16 to be described below, the actual conveying-in timing of the wafer W of the "A12" is performed, being delayed by the waiting time of the "conveying step 14" illustrated in FIG. 13A to level a load of the transfer arm 32.

Figure 14:
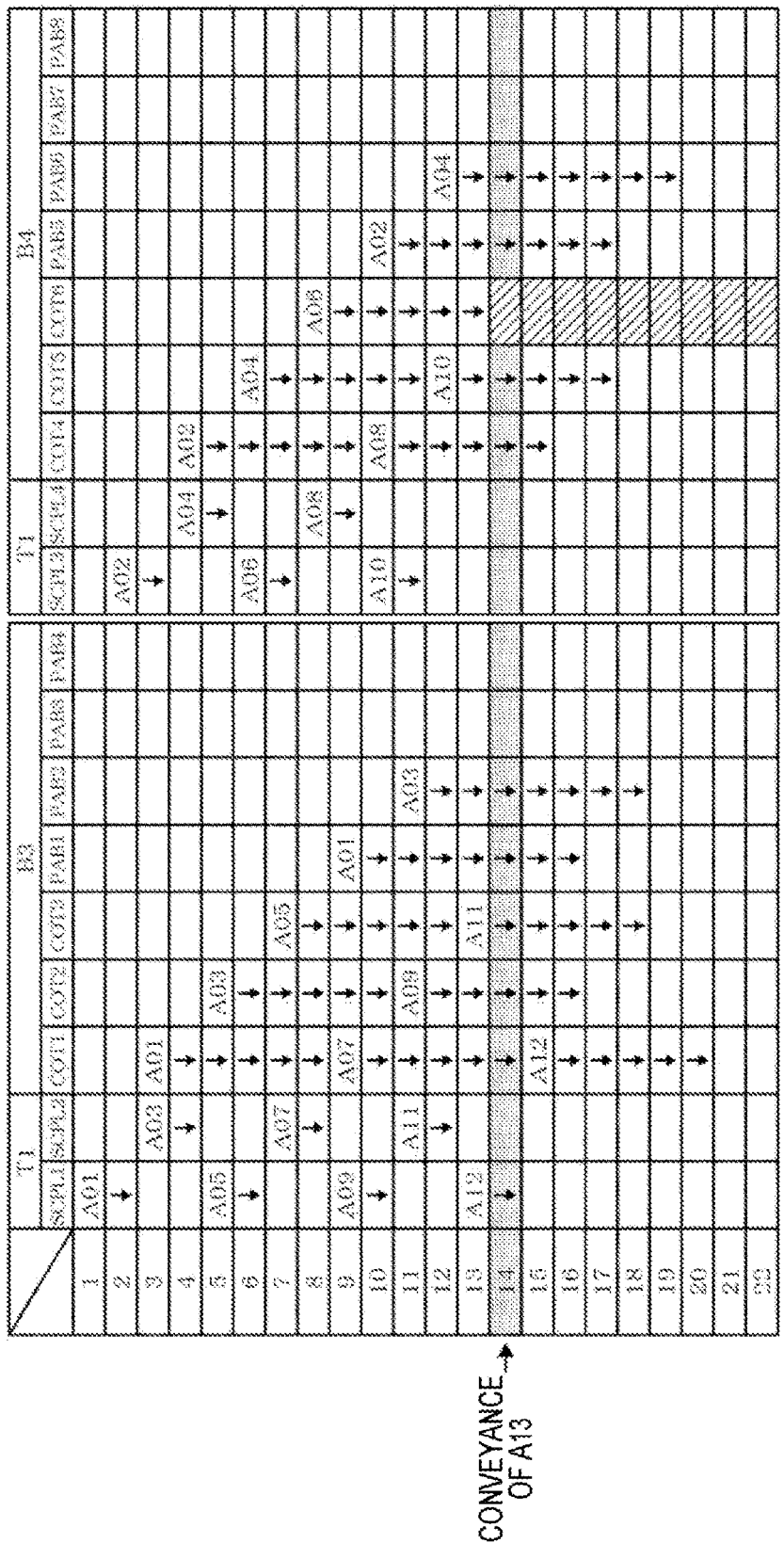
FIG. 14 is a fourth explanation diagram illustrating the operation condition of the COT layer at the time of processing the wafer.
Figure 15B:
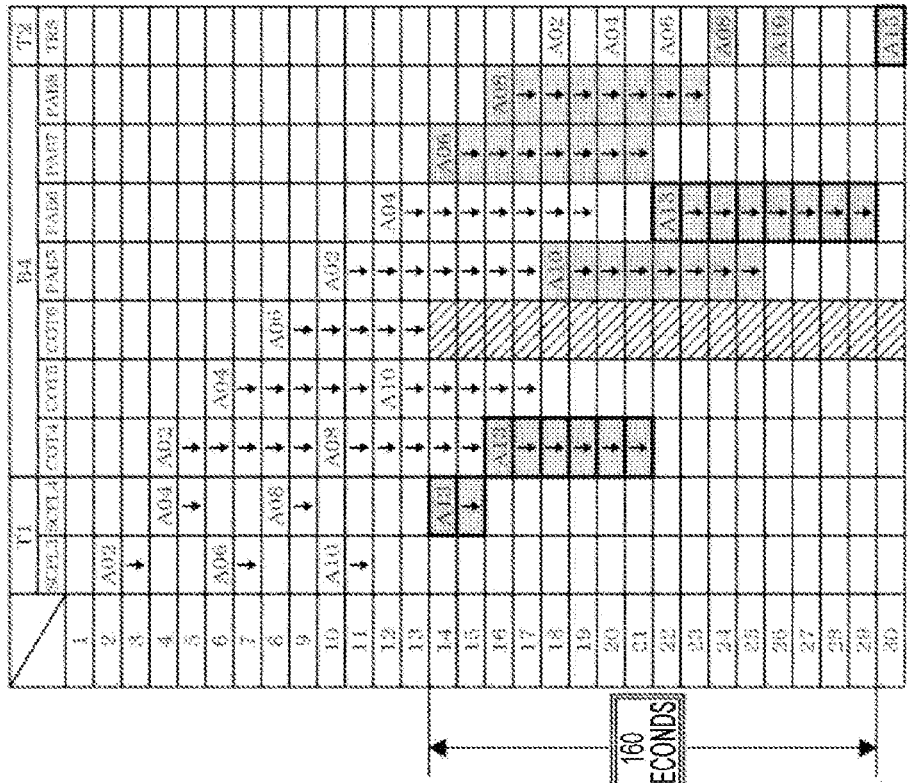
FIGS. 15A & 15B are fourth explanation diagrams illustrating the preparation examples of the individual conveying schedules.
Figure 15A:
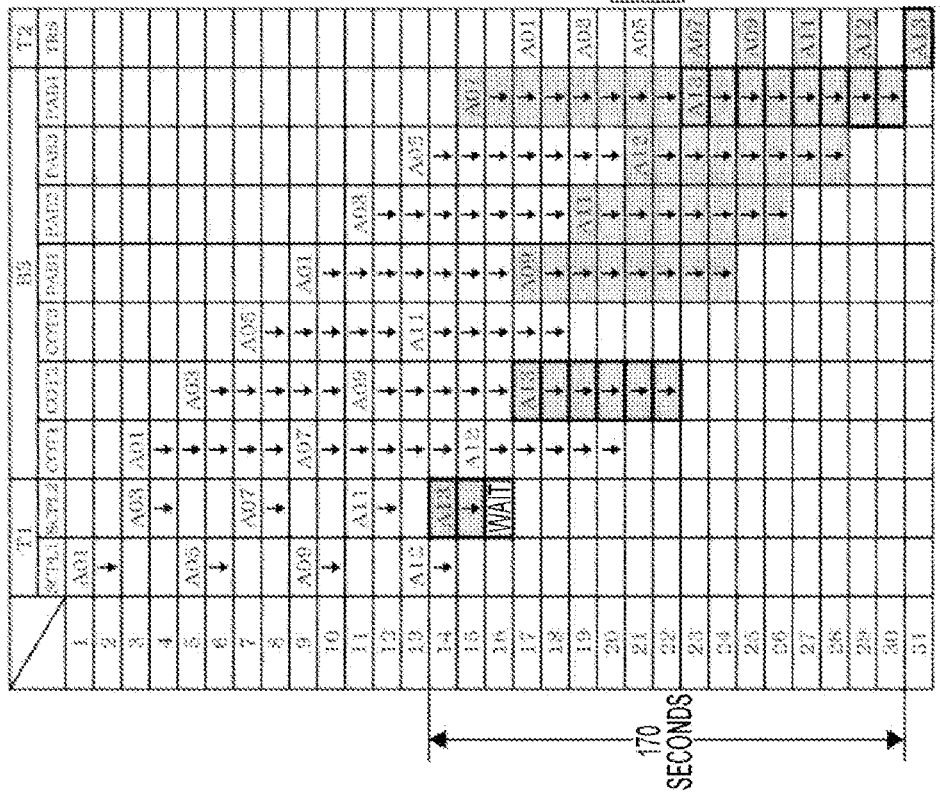

To be continued, as illustrated in FIGS. 14, 15A, and 15B, an individual conveying schedule for a wafer W of subsequent "A13" is prepared and as a result of comparing the residence time, the COT layer B3 is selected as the conveying-in destination of the wafer W.

Figure 16:
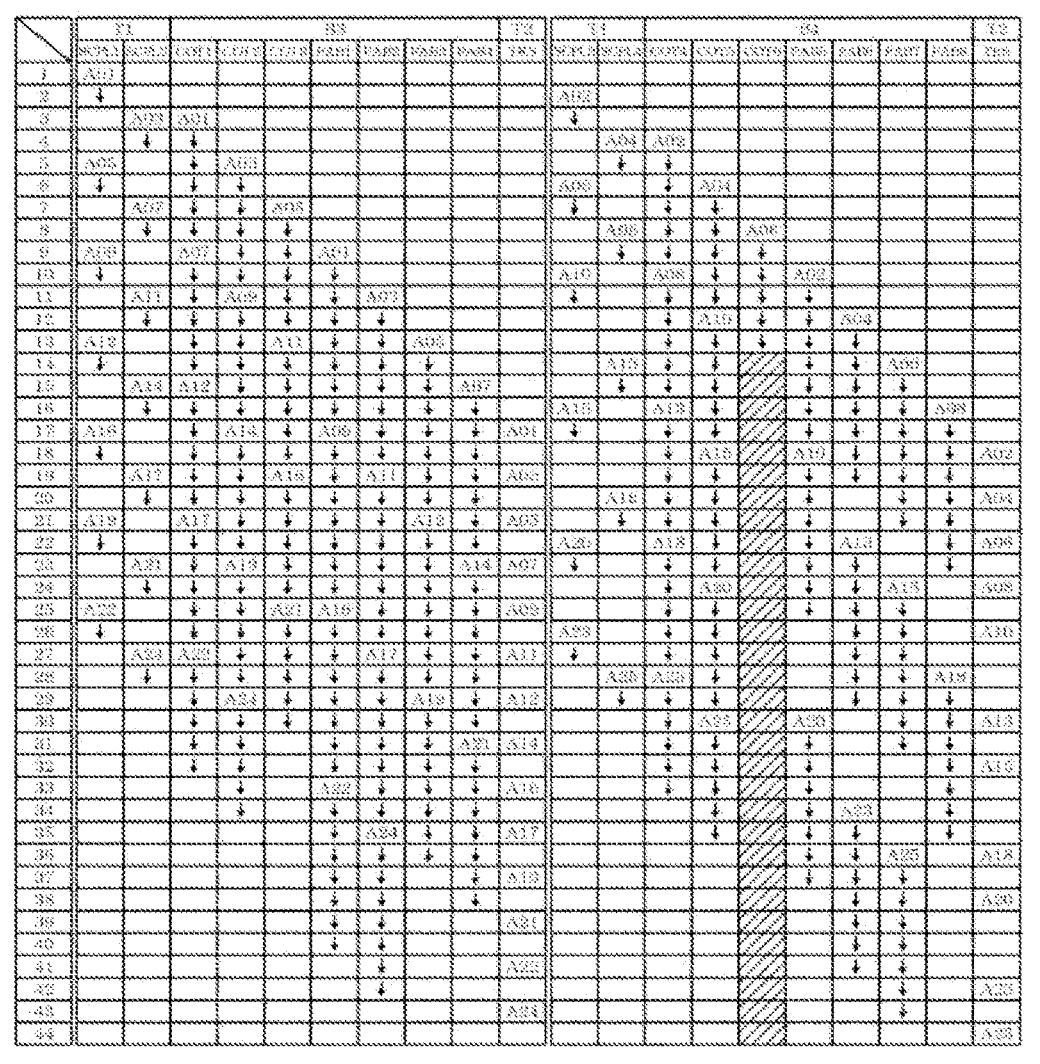

By doing so, when sequential, individual conveying schedules for subsequent wafers W are prepared and the COT layers B3 and B4 which are the conveying destinations are selected, as illustrated in FIG. 16, the wafers are conveyed in the COT layer B3 of one side in order of "A11→A12→A14→A16→A17→..." and the wafers W are conveyed in the COT layer B4 of the other side in order of "A10→A13→A15→A18...".

As the result, after the resist film forming module COT6 may not be used, the conveying control is performed based on the individual conveying schedules selecting the COT layers B3 and B4 different from the simulated conveying schedules (enclosed by a dotted line in FIG. 7) prepared in advance. These individual conveying schedules are prepared each time the conveying operation of the wafer W in the COT layers B3 and B4 is performed. Whenever the individual conveying schedules are prepared, the individual conveying schedule in which the residence time of the wafers W in the COT layers B3 and B4 is short is selected. Therefore, even in the case in which some of the processing modules may not be used while the wafers W within the carrier C are sequentially processed, the optimal (the number of wafers processed per unit time is large) conveying control depending on the operation conditions of the COT layers B3 and B4 may be realized.

Here, the conveyance of the wafers W of the processing modules at back end sides of the COT layers B3 and B4 in which the conveying schedules are changed depending on the operation conditions will be described. Since all the conveying schedules (see FIG. 7) prepared in advance are performed by identifying each wafer W, the wafer W conveyed in the transfer module TRS of the tower T2 is conveyed to each processing module based on the conveying schedule and the processing is performed.

For example, the case in which the wafers W of the "A01 to A12" are transferred to the transfer module TRS of the tower T2 in the conveying schedule of FIG. 7 and the case in which these wafers W are transferred to the same transfer module TRS in the performance result of the individual conveying schedules of the FIG. 16 are compared with each other. In these examples, after the resist film forming module COT6 may not be used, the timing when the conveying-in wafers W of "A12 to A25" are disposed in the transfer module TRS is delayed or a position of a shelf to which the wafers are transferred is changed.

However, a crossing of a transfer order of the "A12 to A25" to the transfer module TRS (for example, the phenomenon that the wafer W of the "A13" is transferred to the transfer module TRS earlier than the wafer W of the "A12") does not occur. Therefore, the accurate processing may be performed on each wafer W when the wafers W transferred to the transfer module TRS of the tower T2 are conveyed based on all the conveying schedules prepared to process the wafers W in order of number of "A01 to A25".

Meanwhile, in FIGS. 12 to 16, the case in which one resist film forming module COT6 may not be used is described by way of example. However, even though the kind or the number of processing modules (temperature control modules SCPL1 to SCPL4, resist film forming modules COT1 to COT6, and heating modules PAB1 to PAB8) is different, the COT layers B3 and B4 may be selected in the same order.

By doing so, the conveyance and the processing of all the wafers W within the carrier are performed (steps S201 and S203 to S207 of FIG. 6) and when the wafers W to be conveyed in the COT layers B3 and B4 are not present (step S202; NO), the operation of selecting the conveying-in destination of the wafers W ends. Further, the processing on all the wafers W within the coating and developing apparatus 1 is performed and the processed wafer W returns to the original carrier C (end of FIG. 5).

The coating and developing apparatus 1 according to the exemplary embodiment of the present invention has the following effects. When the wafers W are conveyed in any one of the COT layers B3 and B4 (including the temperature control modules SCPL1 to SCPL4) which are the plurality of unit modules to which the kind of processing modules (temperature control modules SCPL1 to SCPL4, resist film forming modules COT1 to COT6, and heating modules PAB1 to PAB8) is common and are processed, the individual conveying schedules in the case in which the wafers W are conveyed in each COT layer B3 and B4 are prepared and the COT layers B3 and B4 in which the residence time of the wafer W is shortest are selected based on the result. As the result, the wafer W may be flexibly and efficiently conveyed depending on the operation conditions of each COT layer B3 and B4.

Figure 17:
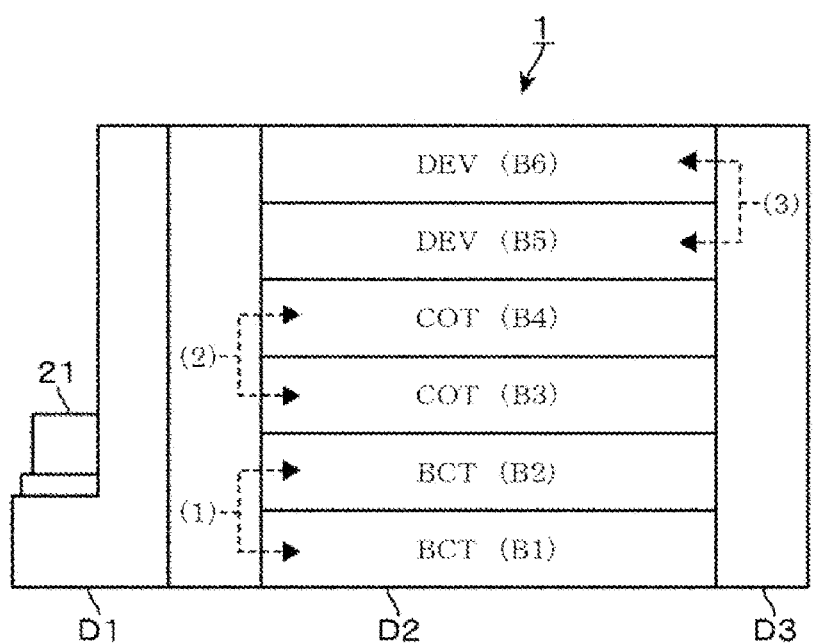
FIG. 17 is an explanation diagram schematically illustrating an example in which the present invention is applied to a selection of a BCT layer or a DEV.

Here, the unit blocks selected by the method using FIGS. 6 to 16 are not limited to the COT layers B3 and B4. For example, when the BCT layers B1 and B2 are selected or the wafers W are conveyed in each group of unit blocks of the DEV layers B5 and B6, the individual schedules may be prepared and the conveying-in destination in which the residence time of the wafers W is shortest may be selected. Further, it is not essential to prepare all the conveying schedules of the coating and developing apparatus 1 in advance. For example, the conveying destination may be determined by preparing the individual schedules at the timings of (1) to (3)

when the wafers W are conveyed in each group of the unit blocks of the BCT layers B1 and B2, the COT layers B3 and B4, and the DEV layers B5 and B6 as illustrated in FIG. 17.

The operation of selecting the COT layers B3 and B4 in the case in which some of the processing modules (in the present example, the resist film forming module COT6) may not be used, which is described with reference to FIGS. 12 to 16, is not limited to the case in which the operation is performed as the measure at the time of the occurrence of the trouble. For example, the plurality of lots is set within the common carrier C and even in the case in which processing contents in wafers W of "W01 to W11" and wafers W of "W12 to W25" are different from each other, and the like, the COT layers B3 and B4 may be selected by the same operation. For example, when the resist film forming module COT6 does not include a function of performing a processing which is performed on the wafers W of the "W12 to W25", the individual conveying schedules are prepared except for the resist film forming module COT6 and the COT layers B3 and B4 are selected.

The configuration of the unit blocks in which the conveying destination is selected by preparing the individual conveying schedules for each wafer W or the number or the kind of processing modules mounted in each unit block may be appropriately changed. For example, two resist film forming modules COT1 to COT are mounted in each of the COT layers B3 and B4 and two protective film forming modules ITC1 to ITC4 which are the liquid processing modules forming a protective film on an upper layer of the resist film may be mounted. Further, instead of mounting the BCT layers B1 and B2, two ITC layers are mounted and the determination of selecting the conveying-in destinations of the wafers W for these ITC layers may be performed.

The number of unit blocks selected from the plurality of unit blocks is not limited to two. For example, even when at least three groups of unit blocks are mounted, the individual conveying schedules for each unit block are prepared and the unit block in which the residence time of the wafers is shortest is selected as the conveying destination of the wafer W.

In addition to this, the unit blocks are not limited to the case in which the unit blocks are vertically stacked in a layer shape. For example, when the unit blocks B1 and B2 of the BCT layer, the unit blocks B3 and B4 of the COT layer, and the unit blocks B5 and B6 of the DEV layer are provided, these unit blocks may be horizontally arranged so that the same kind of unit blocks are adjacent to each other.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A coating and developing apparatus for forming a coating film including a resist film on a substrate taken out from a carrier in which a plurality of sheets of substrates is received and performing developing on the substrate after exposure, the apparatus comprising:
   a plurality of unit blocks each provided with plural kinds of processing modules for forming the coating film on the substrate before exposure or performing the developing on the substrate after exposure and configured to perform the same processing;
   substrate conveying mechanisms each mounted in each of the plurality of unit blocks and configured to convey the substrate between the plural kinds of processing modules in a predetermined order;
   a substrate distributing mechanism configured to distribute and convey the substrate between the plurality of unit blocks; and
   a control unit configured to output a control signal to perform preparing individual conveying schedules in which conveying paths for one substrate to be distributed are arranged according to conditions in each unit block depending on time series when the one substrate is conveyed in each of the plurality of unit blocks prior to distributing the substrate by the substrate distributing mechanism, obtaining a residence time until the one substrate is conveyed in the unit block and is then conveyed out based on the individual conveying schedules corresponding to each unit block, and conveying the one substrate in the unit block having the shortest residence time and conveying the substrate based on the individual conveying schedules prepared for the unit block by the substrate distributing mechanism.

2. The coating and developing apparatus of claim 1, wherein the plural kinds of processing modules includes a liquid processing module configured to coat a coating liquid on the substrate before exposure or supplying a developer to the substrate after exposure and a heating module configured to heat the substrate, and the liquid processing module and the heating module each are configured to be selected among the same processing modules prepared in plural.

3. The coating and developing apparatus of claim 2, wherein the substrate conveying mechanism acquires the substrate from the processing module at an upstream side and includes a first substrate support and a second substrate support to exchange the substrate with a substrate in the processing module at a downstream side.

4. The coating and developing apparatus of claim 2, wherein other processing modules outside the unit blocks are provided and the substrates in the carrier are conveyed in a predetermined order to the processing modules in the unit block and other processing modules and are processed, and
   the control unit outputs the control signal to perform preparing all the conveying schedules, in which the conveying paths of the substrates for the processing modules in the unit blocks and other processing modules for each substrate in the carrier are arranged depending on the time series, in advance, and when the one substrate is conveyed in the unit block having the shortest residence time, conveying the substrate based on the individual conveying schedules for the unit block having the shortest residence time instead of the conveying schedules of the unit blocks included in all the conveying schedules.

5. The coating and developing apparatus of claim 2, wherein the plurality of unit blocks is mounted in plural groups and the substrates in the carrier are conveyed in a predetermined order to the unit blocks of each group and are processed, thereby performing a series of different processings, and
   the control unit outputs the control signal to perform the respective steps for each unit block of each group.

6. The coating and developing apparatus of claim 2, wherein the plurality of unit blocks is vertically stacked.

7. The coating and developing apparatus of claim 1, wherein the substrate conveying mechanism acquires the substrate from the processing module at an upstream side and includes a first substrate support and a second substrate support to exchange the substrate with a substrate within the processing module at a downstream side.

8. The coating and developing apparatus of claim 1, wherein other processing modules outside the unit blocks are provided and the substrates in the carrier are conveyed in a predetermined order to the processing module in the unit block and other processing modules and are processed, and the control unit outputs the control signal to perform preparing all the conveying schedules, in which the conveying paths of the substrate for the processing modules within the unit blocks and other processing modules for each substrate within the carrier are arranged depending on the time series, in advance, and when the one substrate is conveyed in the unit block having the shortest residence time, conveying the substrate based on the individual conveying schedules for the unit block having the shortest residence time instead of the conveying schedules of the unit blocks included in all the conveying schedules.

9. The coating and developing apparatus of claim 1, wherein the plurality of unit blocks is mounted in plural groups and the substrates within the carrier are conveyed in a predetermined order to the unit blocks of each group and are processed, thereby performing a series of different processings, and the control unit outputs the control signal to perform the respective steps for each unit block of each group.

10. The coating and developing apparatus of claim 1, wherein the plurality of unit blocks is vertically stacked.

11. A coating and developing method for forming a coating film including a resist film on a substrate taken out from a carrier in which a plurality of sheets of substrates is received and performing developing on the substrate after exposure, the method comprising:

forming the coating film on the substrate before exposure or performing the developing on the substrate after exposure and performing the same processing by using a plurality of unit blocks each including plural kinds of processing modules, preparing individual conveying schedules in which conveying paths for one substrate to be distributed are arranged according to conditions in each unit block depending on time series when the one substrate is conveyed in each of the plurality of unit blocks prior to distributing the substrate between the plurality of unit blocks and conveying in the distributed substrate;

obtaining residence time until the one substrate is conveyed in the unit block and is then conveyed out based on the individual conveying schedules corresponding to each unit block; and conveying the one substrate in the unit block having the shortest residence time and conveying the substrate based on the individual conveying schedules prepared for the unit blocks.

12. The coating and developing method of claim 11, wherein the plural kinds of processing modules includes a liquid processing module configured to coat a coating liquid on the substrate before exposure or supplying a developer to the substrate after exposure and a heating module configured to heat the substrate, and the liquid processing module and the heating module each are configured to be selected from the same processing modules prepared in plural.

13. The coating and developing method of claim 12, wherein the substrates in the carrier are conveyed in a predetermined order to the processing module in the unit block and other processing modules outside the unit block and are processed, and the coating and developing method includes: preparing all the conveying schedules, in which the conveying paths of the substrates for the processing modules in the unit block and other processing modules for each substrate in the carrier are arranged depending on the time series, in advance; and when the one substrate is conveyed in the unit block having the shortest residence time, conveying the substrate based on the individual conveying schedules for the unit block having the shortest residence time instead of the conveying schedules of the unit block included in all the conveying schedules.

14. The coating and developing method of claim 12, wherein the plurality of unit blocks is used in a plurality of groups and the substrates within the carrier are conveyed in a predetermined order to the unit blocks of each group and are processed, thereby performing a series of different processings, and the respective steps are performed for each unit block of each group.

15. The coating and developing method of claim 11, wherein the substrates in the carrier are conveyed in a predetermined order to the processing module in the unit block and other processing modules outside the unit block and are processed, and the coating and developing method includes: preparing all the conveying schedules, in which the conveying paths of the substrates for the processing modules in the unit block and other processing modules for each substrate in the carrier are arranged depending on the time series, in advance; and when the one substrate is conveyed in the unit block having the shortest residence time, conveying the substrate based on the individual conveying schedules for the unit block having the shortest residence time instead of the conveying schedules of the unit block included in all the conveying schedules.

16. The coating and developing method of claim 11, wherein the plurality of unit blocks is used in a plurality of groups and the substrates within the carrier are conveyed to a predetermined order to the unit blocks of each group and are processed, thereby performing a series of different processings, and the respective steps are performed for each unit block of each group.

17. A storage medium storing a computer program used in a coating and developing apparatus which forms a coating film including a resist film on a substrate and performs developing on the substrate after exposure, wherein the program includes a combination of steps for performing the coating and developing method of claim 11.

* * * * *